(12) United States Patent
Moon et al.

(10) Patent No.: US 11,711,624 B2
(45) Date of Patent: Jul. 25, 2023

(54) IMAGE SENSOR AND IMAGE SENSING SYSTEM INCLUDING THE SAME

(71) Applicant: SAMSUNG ELECTRONICS CO., LTD., Suwon-si (KR)

(72) Inventors: Kyoung Hwan Moon, Suwon-si (KR); Ji Hoon Kim, Suwon-si (KR); Young Jun Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/579,887

(22) Filed: Jan. 20, 2022

(65) Prior Publication Data
US 2022/0377262 A1 Nov. 24, 2022

(30) Foreign Application Priority Data

May 18, 2021 (KR) .................. 10-2021-0064095

(51) Int. Cl.
| | | |
|---|---|---|
| *H04N 25/46* | (2023.01) | |
| *H01L 27/146* | (2006.01) | |
| *H04N 25/11* | (2023.01) | |
| *H04N 25/75* | (2023.01) | |

(52) U.S. Cl.
CPC ......... *H04N 25/46* (2023.01); *H01L 27/1463* (2013.01); *H01L 27/1464* (2013.01); *H01L 27/14621* (2013.01); *H01L 27/14627* (2013.01); *H01L 27/14636* (2013.01); *H01L 27/14645* (2013.01); *H04N 25/11* (2023.01); *H04N 25/75* (2023.01)

(58) Field of Classification Search
CPC ........ H04N 25/46; H04N 25/11; H04N 25/75; H04N 25/42; H01L 27/14621; H01L 27/14627; H01L 27/1463; H01L 27/14636; H01L 27/1464; H01L 27/14645; H01L 27/14601; H01L 27/14643
See application file for complete search history.

(56) References Cited

U.S. PATENT DOCUMENTS

| | | | |
|---|---|---|---|
| 10,057,520 B2 | 8/2018 | Jeong et al. | |
| 10,277,830 B2 | 4/2019 | Sano et al. | |
| 10,715,753 B2 | 7/2020 | Kita | |
| 2012/0268634 A1* | 10/2012 | Fukuda | H01L 27/14627 348/E5.091 |
| 2017/0295331 A1* | 10/2017 | Fukuda | H01L 27/14638 |
| 2020/0137325 A1 | 4/2020 | Mori et al. | |
| 2020/0236312 A1 | 7/2020 | Murata | |
| 2020/0403025 A1* | 12/2020 | Kim | H01L 27/1464 |
| 2020/0404185 A1 | 12/2020 | Noh et al. | |
| 2022/0045110 A1* | 2/2022 | Fujita | H01L 27/1463 |
| 2022/0149091 A1* | 5/2022 | Joe | H01L 27/14645 |
| 2022/0165765 A1* | 5/2022 | Jung | H01L 27/14605 |

* cited by examiner

*Primary Examiner* — Lin Ye
*Assistant Examiner* — John H Morehead, III
(74) *Attorney, Agent, or Firm* — Lee IP Law, P.C.

(57) ABSTRACT

An image sensor includes a pixel defining pattern in a mesh form. A first division pattern divides a pixel area into two halves. A second division pattern divides the pixel area into two halves. A first diagonal division pattern divides the pixel area into two halves. A second diagonal division pattern divides the pixel area into two halves. First through eighth photodiodes are arranged in the pixel area.

20 Claims, 22 Drawing Sheets

FIG. 3
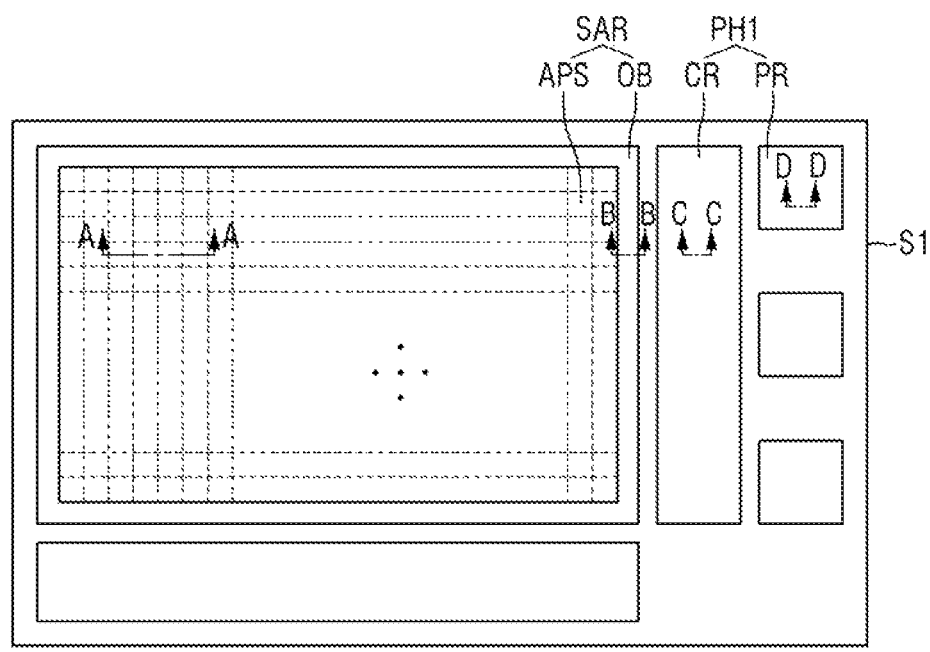
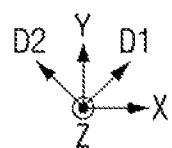

IMAGE SENSOR AND IMAGE SENSING SYSTEM INCLUDING THE SAME

CROSS-REFERENCE TO RELATED APPLICATION

This application claims priority from Korean Patent Application No. 10-2021-0064095 filed on May 18, 2021, in the Korean Intellectual Property Office, and all the benefits accruing therefrom under 35 U.S.C. 119, the contents of which in its entirety are herein incorporated by reference.

BACKGROUND

1. Field

Embodiments relates to an image sensor and an image sensing system including the same.

2. Description of Related Art

An image sensor converts an optical image into an electrical signal. As computer industry and communication industry develop, an image sensor with improved performance is desired in various fields such as a smartphone, a wearable device, a digital camera, a PCS (Personal Communication System), a game console, a security camera, a medical micro camera, etc.

SUMMARY

Embodiments are directed to an image sensor including a substrate, a pixel defining pattern disposed within the substrate and formed in a mesh form, wherein the pixel defining pattern defines each of a plurality of pixel areas along the mesh form, a first division pattern extending along a first direction for dividing at least one pixel area among the plurality of pixel areas into two half portions, a second division pattern extending along a second direction for dividing the at least one pixel area into two half portions, wherein the second direction intersects the first direction, a first diagonal division pattern extending along a first diagonal direction for dividing the at least one pixel area into two half portions, wherein the first diagonal direction intersects the first direction and the second direction, a second diagonal division pattern extending along a second diagonal direction for dividing the at least one pixel area into two half portions, wherein the second diagonal direction intersects the first direction and the second direction, and the first diagonal direction, first and second photodiodes disposed in the at least one pixel area and between the first division pattern and the first diagonal division pattern, wherein the first and second photodiodes are separated from each other via the first division pattern and the first diagonal division pattern, third and fourth photodiodes disposed in the at least one pixel area, and between the second division pattern and the first diagonal division pattern, wherein the third and fourth photodiodes are separated from each other via the second division pattern and the first diagonal division pattern, fifth and sixth photodiodes disposed in the at least one pixel area, and between the first division pattern and the second diagonal division pattern, wherein the fifth and sixth photodiodes are separated from each other via the first division pattern and the second diagonal division pattern, and seventh and eighth photodiodes disposed in the at least one pixel area, and between the second division pattern and the second diagonal division pattern, wherein the seventh and eighth photodiodes are separated from each other via the second division pattern and the second diagonal division pattern.

Embodiments are directed to an image sensor including a substrate, a pixel defining pattern disposed within the substrate and formed in a mesh form, wherein the pixel defining pattern defines each of a plurality of pixel areas along the mesh form, a first division pattern extending along a first direction for dividing at least one pixel area among the plurality of pixel areas into two half portions, a second division pattern extending along a second direction for dividing the at least one pixel area into two half portions, wherein the second direction intersects the first direction, a first diagonal division pattern extending along a first diagonal direction for dividing the at least one pixel area into two half portions, wherein the first diagonal direction intersects the first direction and the second direction, first and second photodiodes disposed in the at least one pixel area and between the first division pattern and the first diagonal division pattern, wherein the first and second photodiodes are separated from each other via the first division pattern and the first diagonal division pattern and third and fourth photodiodes disposed in the at least one pixel area, and between the second division pattern and the first diagonal division pattern, wherein the third and fourth photodiodes are separated from each other via the second division pattern and the first diagonal division pattern, wherein the first photodiode and the third photodiode are separated from each other via the first diagonal division pattern and are disposed adjacent to each other, wherein the second photodiode and the fourth photodiode are separated from each other via the first diagonal division pattern and are disposed adjacent to each other, wherein in a first operation mode, a first binning operation is performed based on a first sensed signal generated from the first photodiode and a fourth sensed signal generated from the fourth photodiode, and a second binning operation is performed based on a second sensed signal generated from the second photodiode and a third sensed signal generated from the third photodiode.

Embodiments are directed to an image sensing system including an image sensor for outputting an image signal and an image signal processor connected to the image sensor for receiving and processing the image signal, wherein the image sensor includes a substrate, a pixel defining pattern disposed within the substrate and formed in a mesh form, wherein the pixel defining pattern defines each of a plurality of pixel areas along the mesh form, a first division pattern extending along a first direction for dividing at least one pixel area among the plurality of pixel areas into two half portions, a second division pattern extending along a second direction for dividing the at least one pixel area into two half portions, wherein the second direction intersects the first direction, a first diagonal division pattern extending along a first diagonal direction for dividing the at least one pixel area into two half portions, wherein the first diagonal direction intersects the first direction and the second direction, a second diagonal division pattern extending along a second diagonal direction for dividing the at least one pixel area into two half portions, wherein the second diagonal direction intersects the first direction and the second direction, and the first diagonal direction, first and second photodiodes disposed in the at least one pixel area and between the first division pattern and the first diagonal division pattern, wherein the first and second photodiodes are separated from each other via the first division pattern and the first diagonal division pattern, third and fourth photodiodes disposed in the at least one pixel area, and between the second division pattern and the first diagonal division pattern, wherein the third and fourth photodiodes are separated from each other via the second division pattern and the first diagonal division pattern, fifth and sixth photodiodes disposed in the at least one pixel area, and between the first division pattern and the second diagonal division pattern, wherein the fifth and sixth photodiodes are separated from each other via the first division pattern and the second diagonal division pattern and seventh and eighth photodiodes disposed in the at least one pixel area, and between the second division pattern and the second diagonal division pattern, wherein the seventh and eighth photodiodes are separated from each other via the second division pattern and the second diagonal division pattern.

BRIEF DESCRIPTION OF DRAWINGS

Features will become apparent to those of skill in the art by describing in detail example embodiments with reference to the attached drawings in which:

FIG. 3 is a plan view of the image sensor layout of FIG. 2;

DETAILED DESCRIPTIONS

Figure 1:
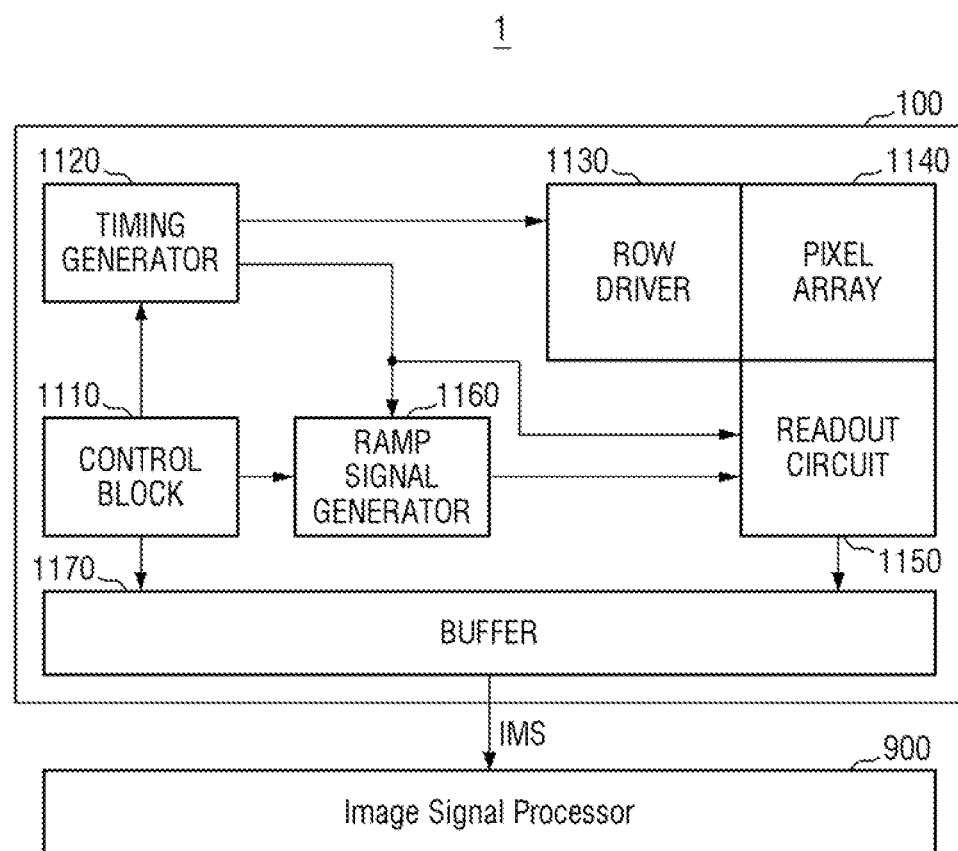
FIG. 1 is a block diagram of an image sensing system according to an example embodiment.

FIG. 1 is a block diagram of an image sensing system 1 according to an example embodiment.

Referring to FIG. 1, the image sensing system 1 may include an image sensor 100 and an image signal processor 900.

The image sensor 100 may sense an image of a sensing target using light to generate an image signal IMS. The generated image signal IMS may be, e.g., a digital signal.

The image signal IMS may be provided to and processed by the image signal processor 900. The image signal processor 900 may receive the image signal IMS output from a buffer 1170 of the image sensor 100 and process the received image signal IMS to facilitate displaying thereof.

The image signal processor 900 may perform digital binning on the image signal IMS output from the image sensor 100. In various implementations, the image signal IMS output from the image sensor 100 may be a raw image signal from a pixel array 1140 which is not subjected to analog binning, or may be an image signal IMS on which the analog binning has already been performed.

The image sensor 100 and the image signal processor 900 may be disposed separately from each other as shown in FIG. 1. For example, the image sensor 100 may be mounted on a first chip, while the image signal processor 900 may be mounted on a second chip. The image sensor 100 and the image signal processor 900 may communicate with each other over a predefined interface. In another implementation, the image sensor 100 and the image signal processor 900 may be integrated into one package, e.g., a multi-chip package (MCP).

The image sensor 100 may include a control register block 1110, a timing generator 1120, a row driver 1130, the pixel array 1140, a readout circuit 1150, a ramp signal generator 1160, and the buffer 1170.

The control register block 1110 may control all operations of the image sensor 100. The control register block 1110 may directly transmit an operation signal to the timing generator 1120, the ramp signal generator 1160 and the buffer 1170.

The timing generator 1120 may generate a signal as a reference for an operation timing of each of the various components of the image sensor 100. The operation timing reference signal generated by the timing generator 1120 may be transmitted to the row driver 1130, the readout circuit 1150, the ramp signal generator 1160, and the like.

The ramp signal generator 1160 may generate and transmit a ramp signal to be used in the readout circuit 1150. The readout circuit 1150 may include a correlated double sampler (CDS), a comparator, etc. The ramp signal generator 1160 may generate and transmit the ramp signal to be used in the correlated double sampler (CDS), the comparator, and the like.

The buffer 1170 may include, e.g., a latch. The buffer 1170 may temporarily store therein the image signal IMS, to be provided to an external component. The image signal IMS may be transmitted to an external memory or an external device.

The pixel array 1140 may sense an external image. The pixel array 1140 may include a plurality of pixels (or unit pixels). The row driver 1130 may selectively activate a row of the pixel array 1140.

The readout circuit 1150 may sample a pixel signal received from the pixel array 1140, compare the sampled pixel signal with the ramp signal, and convert an analog image signal (data) into a digital image signal (data) based on the comparison result.

Figure 2:
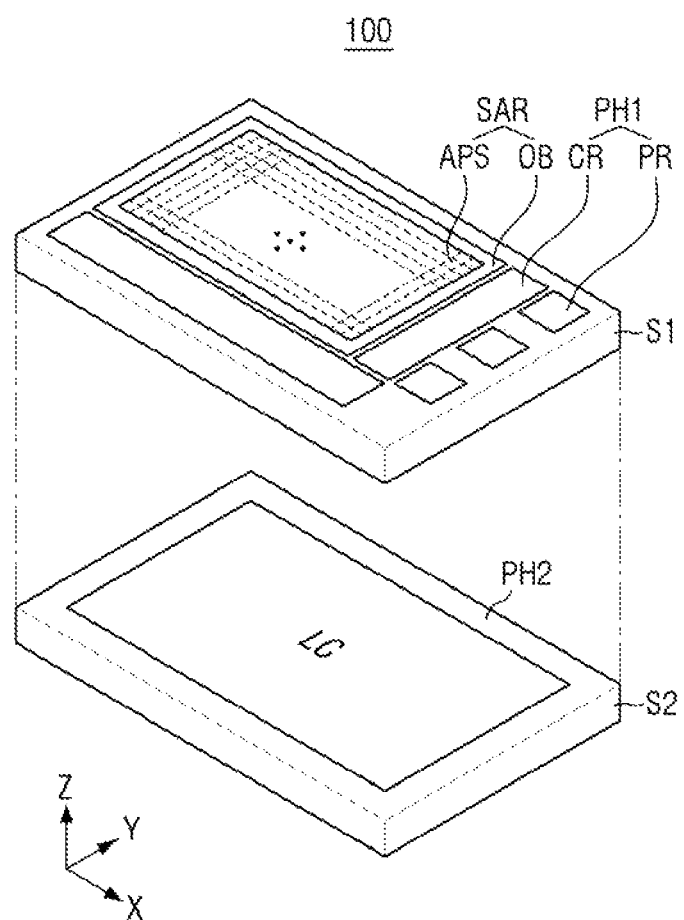
FIG. 2 is a diagram of a conceptual layout of an image sensor of FIG. 1.

FIG. 2 is a diagram of a conceptual layout of the image sensor of FIG. 1. FIG. 3 is a plan view of the image sensor layout of FIG. 2.

Referring to FIG. 2 and FIG. 3, the image sensor 100 may include a first area S1 and a second area S2 stacked in a third direction Z. Each of the first area S1 and the second area S2 may extend in a first direction X and a second direction Y intersecting the third direction Z as shown. The blocks shown in FIG. 1 may be disposed in the first area S1 and the second area S2.

Although not shown in the drawing, a third area in which a memory is disposed may be disposed under the second area S2. The memory disposed in the third area may receive image data from the first area S1 and the second area S2, store the data or process the data and retransmit the image data to the first area S1 and the second area S2. The memory may include a memory element such as a DRAM (dynamic random access memory) element, an SRAM (static random access memory) element, an STT-MRAM (spin transfer torque magnetic random access memory) element, and a flash memory element. When the memory includes, e.g., the DRAM element, the memory may receive and process the image data at a relatively high speed. In an implementation, the memory may be disposed in the second area S2.

The first area S1 may include a sensor array area SAR and a first peripheral area PH1. The second area S2 may include a logic circuit area LC and a second peripheral area PH2. The first area S1 and the second area S2 may be sequentially stacked vertically.

In the first area S1, the sensor array area SAR may include a light-receiving area APS for an active pixel sensor array, which may correspond to the pixel array 1140 of FIG. 1. In the sensor array area SAR, a plurality of unit pixels may be arranged two-dimensionally (for example, in a matrix form).

The sensor array area SAR may include the light-receiving area APS and a light-blocking area OB to which light is exposed. Arrays of active pixel sensors that receive light and generate an active signal may be arranged in the light-receiving area APS. Optical black pixels that block light and generate an optical black signal may be arranged in the light-blocking area OB. The light-blocking area OB may be formed, e.g., along a perimeter of the light-receiving area APS.

Dummy pixels (not shown) may be formed in a portion of the light-receiving area APS adjacent to the light-blocking area OB.

The first peripheral area PH1 may include a connection area CR and a pad area PR. The connection area CR may be formed around the sensor array area SAR. The connection area CR may be formed on one side of the sensor array area SAR. Lines may be formed in the connection area CR to transmit and receive electrical signals of the sensor array area SAR.

The pad area PR may be formed around the sensor array area SAR. The pad area PR may be adjacent to an edge of the image sensor. The pad area PR may be connected to the external device and the like, such that the image sensor 100 and the external device transmit and receive electrical signals to and from each other via the pad area.

In the second area S2, the logic circuit area LC may include electronic elements including a plurality of transistors. The electronic elements contained in the logic circuit area LC may be electrically connected to a pixel array PA (see, e.g., FIG. 4) to provide a constant signal to each of the unit pixels of the active pixel sensor array APS or to control an output signal.

The control register block 1110, the timing generator 1120, the row driver 1130, the pixel array 1140, the readout circuit 1150, the ramp signal generator 1160, the buffer 1170, etc. as described above with reference to FIG. 1 may be disposed in the logic circuit area LC. Blocks other than the active pixel sensor array APS among the blocks of FIG. 1 may be disposed in the logic circuit area LC.

The second peripheral area PH2 may be disposed in the second area S2 in a positionally corresponding manner to the first peripheral area PH1 of the first area S1.

Figure 4:
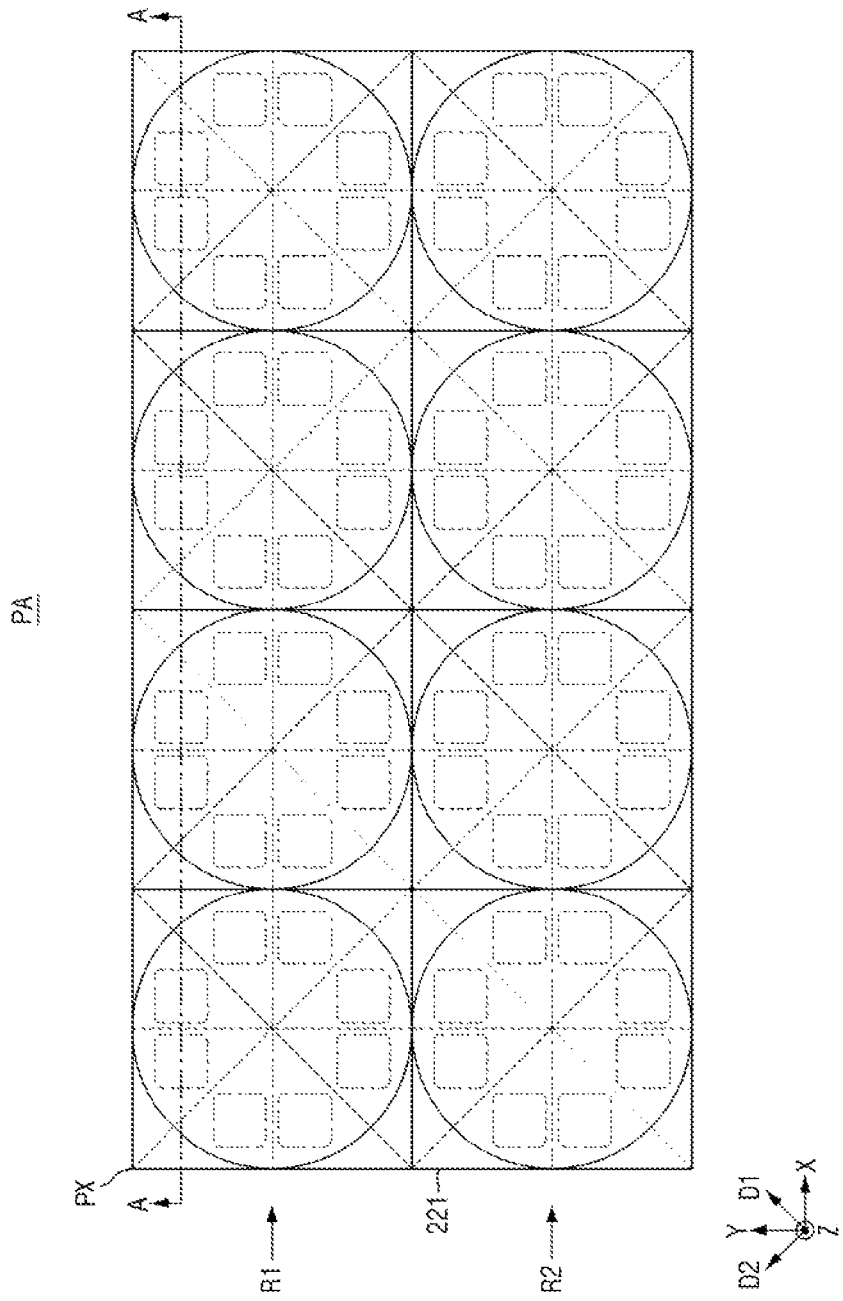
FIG. 4 and FIG. 5 are diagrams of a pixel array area according to an example embodiment.
Figure 5:
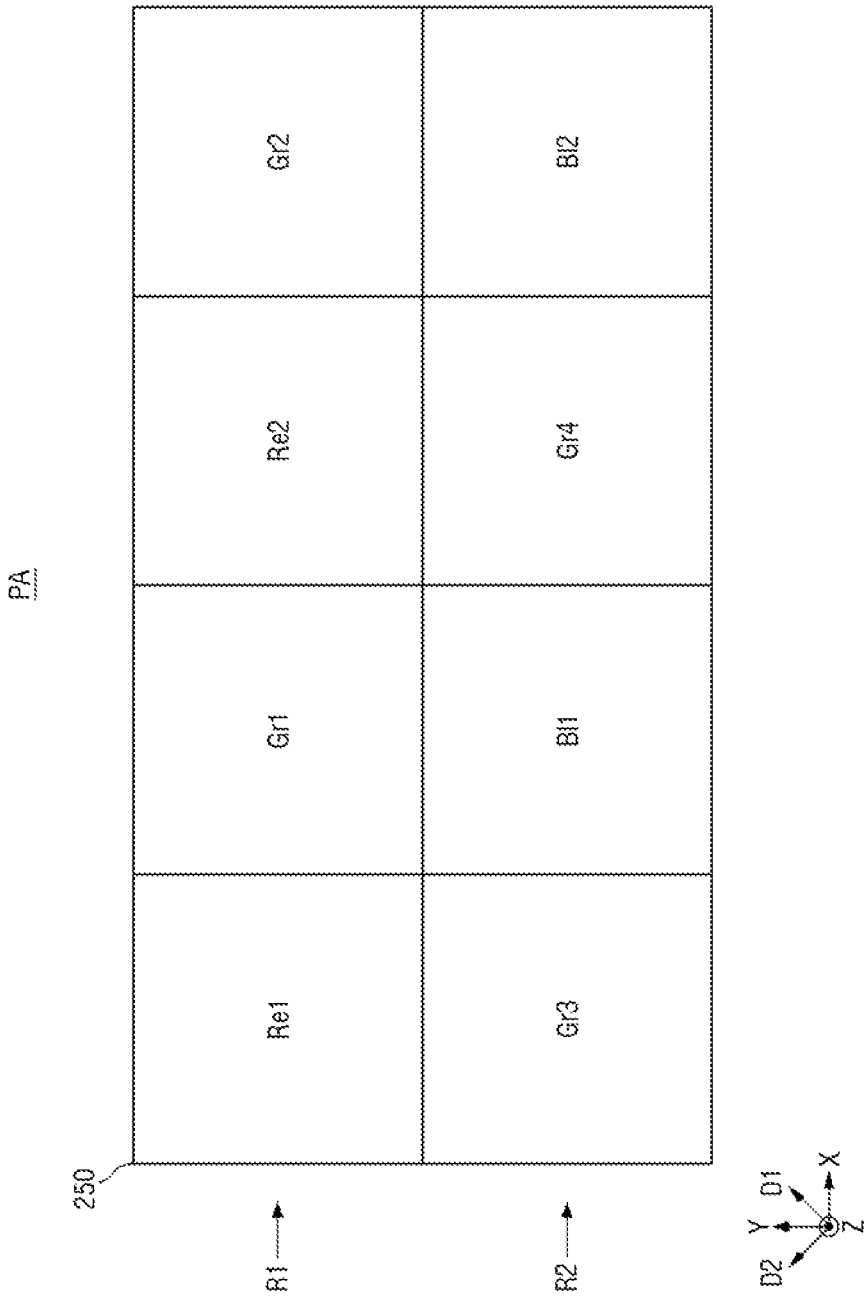

FIG. 4 and FIG. 5 are diagrams of a pixel array area according to an example embodiment.

Referring to FIG. 4 and FIG. 5, the pixel array area PA may include a plurality of pixel areas PX. The pixel array area PA may be contained in the image sensor 100. For example, the pixel array area PA may be implemented as the active pixel sensor array APS of FIG. 3 or the pixel array 140 of FIG. 1.

The plurality of pixel areas PXs may include at least one of the unit pixels contained in the pixel array area PA. Each of the plurality of pixel areas PXs may be defined by a pixel defining pattern 221 formed in a mesh form including a first row R1 and a second row R2 extending in the first direction X. The first row R1 and the second row R2 may be arranged in a direction opposite to the second direction Y.

For example, the plurality of pixel areas PXs may be arranged and spaced apart from each other by a constant spacing along each of the first direction X and the second direction Y as shown in FIG. 4.

FIG. 4 may be a view of the pixel array area PA of FIG. 3 in a direction opposite to the third direction Z. The plurality of pixel areas PXs may be regularly arranged along the first direction X and the second direction Y. Thus, the pixel array area PA may include one pixel area PX.

A color filter grid 250 (see FIG. 5) may be stacked on the pixel defining pattern 221 in the third direction Z. The color filter grid 250 may be contained in the image sensor 100, and may be contained in the pixel array area PA.

The color filter grid 250 may be formed in the same form as the mesh form of the pixel defining pattern 221, so that at least a portion thereof overlaps with the pixel defining pattern 221 in the third direction Z.

An area where the color filter is disposed may be defined by the color filter grid 250 formed in a mesh form including the first row R1 and the second row R2 extending in the first direction X.

A first red color filter Re1, a first green color filter Gr1, a second red color filter Re2, and a second green color filter Gr2 may be arranged in the first row R1. A third green color filter Gr3, a first blue color filter Bl1, a fourth green color filter Gr4, and a second blue color filter Bl2 may be arranged in the second row R2.

Types of color filters between adjacent ones of the green color filters Gr1 to Gr4 may be different from each other in the first direction X or the second direction Y. The arrangement of the green color filters Gr1 to Gr4 may be equally applied to an arrangement of the red color filters Re1 and Re2 and an arrangement of the blue color filters Bl1 and Bl2. In the arrangement of the color filters in FIG. 5, the green color filters Gr1 to Gr4 may be arranged in an adjacent manner to each other in each of a first diagonal direction D1 and a second diagonal direction D2 intersecting the first direction X and the second direction Y.

When each unit pixel that is exposed to light through each of the green color filters Gr1 to Gr4 operates as an autofocusing (AF) pixel, the unit pixels are adjacent to each other in each of the first diagonal direction D1 and the second diagonal direction D2. Thus, AF performance may be improved when performing an autofocusing operation directly in each of the first diagonal direction D1 and the second diagonal direction D2.

Figure 6:
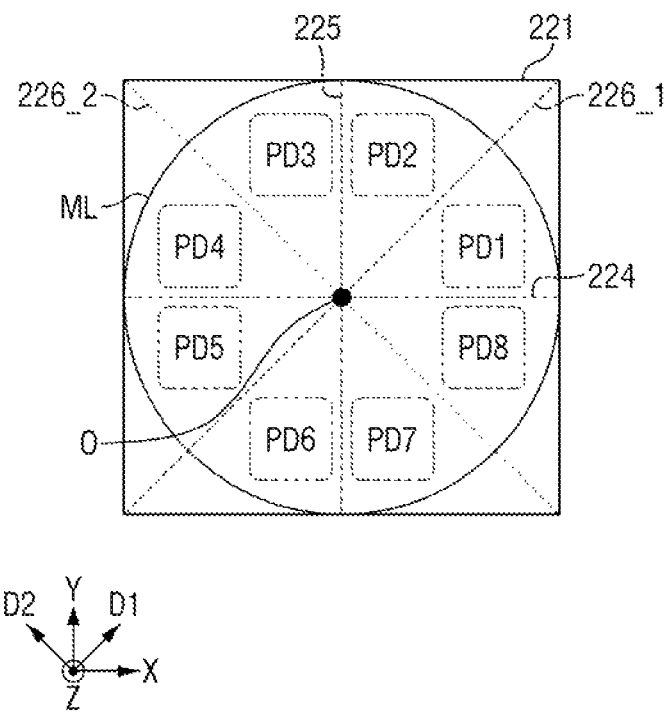
FIG. 6 is an enlarged view of a layout of a pixel of FIG. 4.
Figure 7:
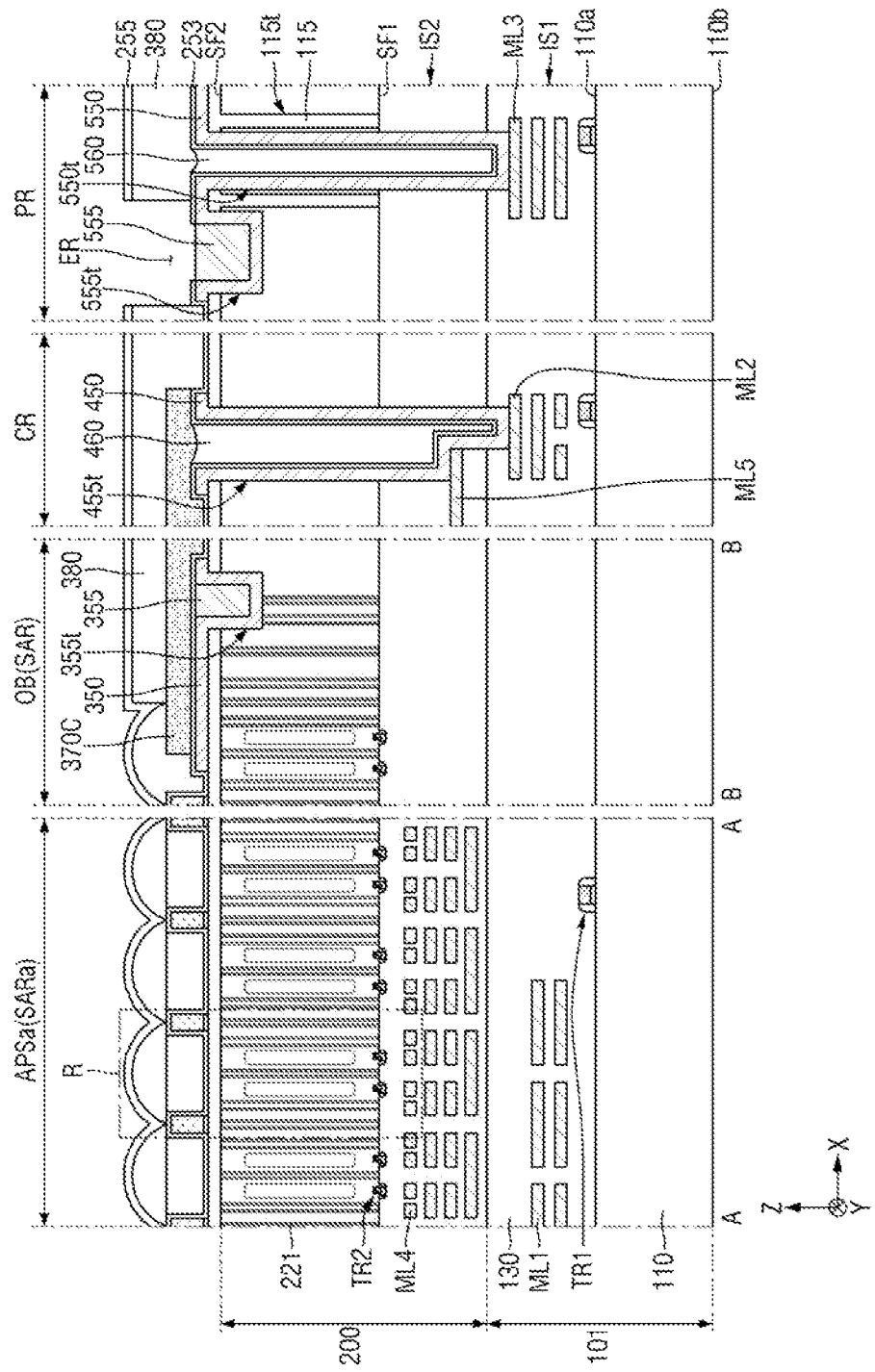
FIG. 7 is cross-sectional views taken along lines A-A, B-B, C-C, and D-D of FIG. 3.
Figure 8:
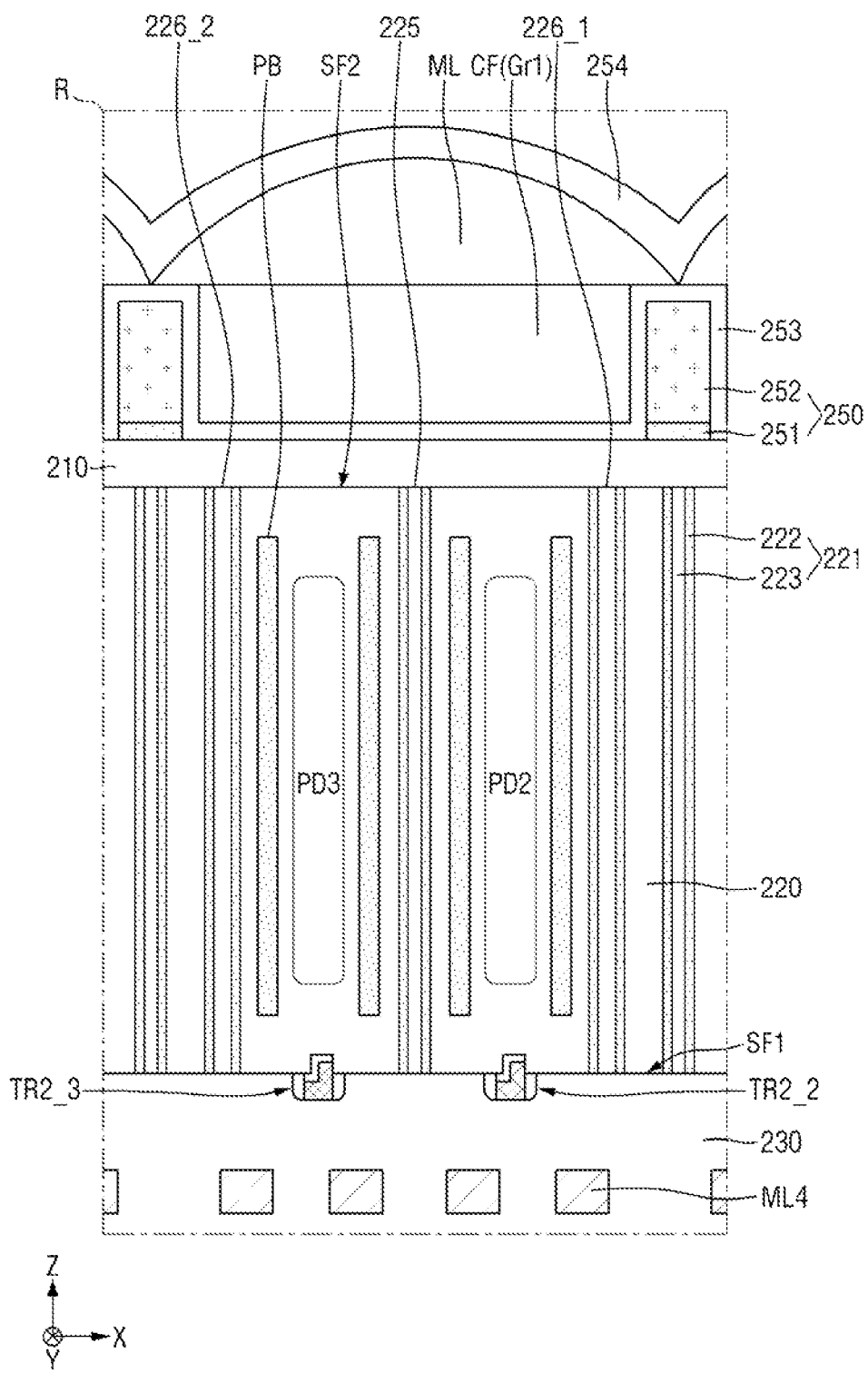
FIG. 8 is an enlarged view of an area R of FIG. 7.

FIG. 6 is an enlarged view of a layout of a pixel of FIG. 4. FIG. 7 is cross-sectional views taken along lines A-A, B-B, C-C, and D-D of FIG. 3. FIG. 8 is an enlarged view of an area R of FIG. 7.

Referring to FIG. 3, FIG. 4, and FIG. 6 to FIG. 8, an image sensor according to an example embodiment may include a first semiconductor substrate 110, a first line structure IS1, a second semiconductor substrate 220, a second line structure IS2, a surface insulating layer 210, a grid pattern for the color filter grid 250, a color filter CF, and a micro lens ML.

The first semiconductor substrate 110 may be implemented as a bulk silicon or SOI (silicon-on-insulator). The first semiconductor substrate 110 may be implemented as a silicon substrate, or may include a material other than silicon, e.g., silicon germanium, indium antimonide, lead telluride, indium arsenide, indium phosphide, gallium arsenide or gallium antimonide. In an implementation, the first semiconductor substrate 110 may include a base substrate and an epitaxial layer formed on the base substrate.

The first semiconductor substrate 110 may include opposite first and second faces 110*a* and 110*b*. The first face 110*a* of the first semiconductor substrate 110 may face toward a third face SF1 of the second semiconductor substrate 220.

A plurality of electronic elements may be formed on the first semiconductor substrate 110. For example, a first electronic element TR1 may be formed on the first face 110*a* of the first semiconductor substrate 110. The first electronic element TR1 may be electrically connected to a sensor array area SARa, and may transmit/receive an electrical signal to and from each of unit pixel areas PX of the sensor array area SARa. For example, the first electronic element TR1 may act as an electronic element constituting each of the control register block 1110, the timing generator 1120, the row driver 1130, the active pixel sensor array APS, the readout circuit 1150, the ramp signal generator 1160, and the buffer 1170 in FIG. 1.

The first line structure IS1 may be formed on the first semiconductor substrate 110. For example, the first line structure IS1 may cover the first face 110*a* of the first semiconductor substrate 110. The first semiconductor substrate 110 and the first line structure IS1 may constitute a first substrate structure 101.

The first line structure IS1 may be attached to the second line structure IS2. For example, as shown in FIG. 7, a top face of the first line structure IS1 may be attached to a bottom face of the second line structure IS2.

The first line structure IS1 may be composed of one line or a plurality of lines. For example, the first line structure IS1 may include a first inter-line insulating film 130, and a plurality of lines ML1, ML2, and ML3 in the first inter-line insulating film 130. The first inter-line insulating film 130 may include, e.g., at least one of silicon oxide, silicon nitride, silicon oxynitride, and a low-k material having a lower dielectric constant than that of silicon oxide. The first line structure IS1 may include the same material as that of the second line structure IS2.

At least some of the lines ML1, ML2, and ML3 of the first line structure IS1 may be connected to the first electronic element TR1. The first line structure IS1 may include a first line ML1 in the sensor array area SARa, a second line ML2 in the connection area CR, and a third line ML3 in the pad area PR. The second line ML2 may act as a topmost line among a plurality of lines in the connection area CR, and the third line ML3 may act as a topmost line among a plurality of lines in the pad area PR.

Each of the first line ML1, the second line ML2 and the third line ML3 may include, e.g., at least one of tungsten (W), copper (Cu), aluminum (Al), gold (Au), silver (Ag), and alloys thereof.

The second semiconductor substrate 220 may be implemented as a semiconductor substrate. For example, the second semiconductor substrate 220 may be implemented as bulk silicon or an SOI (silicon-on-insulator). The second semiconductor substrate 220 may be implemented as a silicon substrate, or may include a material other than silicon, e.g., a semiconductor material including, e.g., silicon germanium, indium antimonide, lead telluride, indium arsenide, indium phosphide, gallium arsenide, or gallium antimonide. In another implementation, the second semiconductor substrate 220 may include a base substrate, and an epitaxial layer formed on the base substrate.

The second semiconductor substrate 220 may include third and fourth faces SF1 and SF2 facing opposite each other. The third face SF1 may be referred to as a front face of the second semiconductor substrate 220, while the fourth face SF2 may be referred to as a rear face of the second semiconductor substrate 220. The fourth face SF2 of the second semiconductor substrate 220 may act as a light receiving face to which light may be incident. A portion of the fourth face SF2 in the pixel area PX may be exposed to the light. Thus, the image sensor may be implemented as a back-side illumination (BSI) image sensor.

The plurality of pixel areas PXs may be formed in the second semiconductor substrate 220 of the sensor array area SARa. A micro lens ML and a color filter CF may be disposed on each of the plurality of pixel areas PXs. Although only a micro lens of a normal pixel is illustrated in the drawing, e.g., a super PD lens may be disposed on each of the plurality of pixel areas PXs.

The pixel area PX may include the second semiconductor substrate 220, first to eighth photodiodes PD1 to PD8, a second transistor TR2, a pixel defining pattern 221, a first division pattern 224, a second division pattern 225, a first diagonal division pattern 226_1, and a second diagonal division pattern 226_2.

The second transistor TR2 may be disposed on the third face SF1 of the second semiconductor substrate 220. The second transistor TR2 may include, e.g., at least some of various transistors (for example, a transfer transistor, a reset transistor, a source follower transistor, and a select transistor) constituting the unit pixel of the image sensor.

The second transistor TR2 may act as the transfer transistor of the image sensor 100, and may be implemented to have a vertical transfer gate (VTG) structure. The second transistor TR2 may include, e.g., a second-second and a second-third transistors TR2_2 and TR2_3.

The transfer transistor as the second transistor TR2 may transfer a sensed signal (charge) generated in a corresponding photodiode to a floating diffusion area. An impurity area corresponding to a source/drain of the transfer transistor may act as the floating diffusion area. In one example, the second-second transistor 2_2 may transmit the sensed signal generated in a second photodiode PD2 to the floating diffusion area, while the second-third transistor TR2_3 may transmit the sensed signal generated in the second photodiode PD2 to the floating diffusion area.

However, the second transistor TR2 may be other than the transfer transistor.

The pixel defining pattern 221 may be formed in a mesh form and in the second semiconductor substrate 220, and may define each of the plurality of pixel areas PXs along the mesh form. Each of the plurality of pixel areas PXs may correspond to the unit pixel. The plurality of pixel areas PXs may be arranged in a two-dimensional matrix form in the first direction X and the second direction Y in a plan view. The pixel defining pattern 221 may be formed by embedding an insulating material into a deep trench formed by patterning the second semiconductor substrate 220.

The pixel defining pattern 221 may include an insulating spacer film 222 and a conductive filling pattern 223. The insulating spacer film 222 may extend conformally to and along a side face of the trench in the second semiconductor substrate 220. The conductive filling pattern 223 may be formed on the insulating spacer film 222 to fill a portion of the trench in the second semiconductor substrate 220.

The pixel defining pattern 221 may have a width of about 10 nm to about 500 nm. For example, the pixel isolation pattern 120 may have a width of about 100 nm to about 400 nm. Although the width of the pixel defining pattern 221 is shown to be uniform, the width of the pixel defining pattern 221 may be non-uniform.

The pixel area PX may include the first division pattern 224, the second division pattern 225, the first and second diagonal division patterns 226_1 and 226_2, and the first to eighth photodiodes PD1 to PD8.

A length in the first direction X or the second direction Y of the pixel area PX defined by the pixel defining pattern 221 may be, e.g., in a range of about 0.3 µm to about 3.0 µm, and, e.g., in a range of about 0.9 µm to about 1.5 µm. It is illustrated that the length in the first direction X and the length of the second direction Y are identical to each other in each pixel area PX. The length in the first direction X and the length of the second direction Y may be different from each other.

The first division pattern 224 may pass through a center O of the pixel area PX, and may extend in the first direction X and divide the pixel area PX into an upper half portion and a lower half portion arranged in the second direction Y.

A width of the first division pattern 224 may be, e.g., in a range of about 10 nm to about 500 nm, and, e.g., in a range of about 100 nm to about 400 nm. A material and a structure of the first division pattern 224 may be the same as those of the pixel defining pattern 221.

The second division pattern 225 may pass through the center O of the pixel area PX, and may extend in the second direction Y and divide the pixel area PX into a left half portion and a right half portion arranged in the first direction X.

A width of the second division pattern 225 may be, e.g., in a range of about 10 nm to about 500 nm, and, e.g., in a range of about 100 nm to about 400 nm. A material and a structure of the second division pattern 225 may be the same as those of the pixel defining pattern 221.

The first diagonal division pattern 226_1 may pass through the center O of the pixel area PX, and may extend in the first diagonal direction D1 and divide the pixel area PX into two diagonal half portions along the first diagonal direction D1.

A width of the first diagonal division pattern 226_1 may be, e.g., in a range of about 10 nm to about 500 nm, and, e.g., in a range of about 100 nm to about 400 nm. A material and a structure of the first diagonal division pattern 226_1 may be the same as those of the pixel defining pattern 221.

The second diagonal division pattern 226_2 may pass through the center O of the pixel area PX, and may extend in the second diagonal direction D2 and divide the pixel area PX into two diagonal half portions along the second diagonal direction D2.

A width of the second diagonal division pattern 226_2 may be, e.g., in a range of about 10 nm to about 500 nm, and, e.g., in a range of about 100 nm to about 400 nm. A material and a structure of the second diagonal division pattern 226_2 may be the same as those of the pixel defining pattern 221.

The first to eighth photodiodes PDs may be formed in the second semiconductor substrate 220. The first to eighth photodiodes PDs may generate charges in proportion to an amount of light incident thereto from an outside. The first to eighth photodiodes PDs may be formed by doping impurities into the second semiconductor substrate 220. When the second semiconductor substrate 220 is doped with a p-type impurity, the first to eighth photodiodes PDs may be doped with an n-type impurity. Thus, a type of the impurity doped into the second semiconductor substrate 220 may be different from a type of the impurity doped into the first to eighth photodiodes PDs.

Each of the first and fifth photodiodes PD1 and PD5 may be disposed between the first division pattern 224 and the first diagonal division pattern 226_1, and may be separated from each other via the first division pattern 224 and the first diagonal division pattern 226_1.

Each of the second and sixth photodiodes PD2 and PD6 may be disposed between the second division pattern 225 and the first diagonal division pattern 226_1, and may be separated from each other via the second division pattern 225 and the first diagonal division pattern 226_1.

Each of the third and seventh photodiodes PD3 and PD7 may be disposed between the second division pattern 225 and the second diagonal division pattern 226_2, and may be separated from each other via the second division pattern 225 and the second diagonal division pattern 226_2.

Each of the fourth and eighth photodiode PD4 and PD8 may be disposed between the first division pattern 224 and the second diagonal division pattern 226_2, and may be separated from each other via the first division pattern 224 and the second diagonal division pattern 226_2.

The first photodiode PD1 and the second photodiode PD2 may be separated from each other via the first diagonal division pattern 226_1, and may be disposed adjacent to each other. The fifth photodiode PD5 and the sixth photodiode PD6 may be separated from each other via the first diagonal division pattern 226_1 and disposed adjacent to each other.

The third photodiode PD3 and the fourth photodiode PD4 may be separated from each other via the second diagonal division pattern 226_2, and disposed adjacent to each other. The seventh photodiode PD7 and the eighth photodiode PD8 may be separated from each other via the second diagonal division pattern 226_2 and disposed adjacent to each other.

The first photodiode PD1 and the eighth photodiode PD8 may be separated from each other via the first division pattern 224 and disposed adjacent to each other. The fourth photodiode PD4 and the fifth photodiode PD5 may be separated from each other via the first division pattern 224 and disposed adjacent to each other.

The second photodiode PD2 and the third photodiode PD3 may be separated from each other via the second division pattern 225 and disposed adjacent to each other. The sixth photodiode PD6 and the seventh photodiode PD7 may be separated from each other via the second division pattern 225 and disposed adjacent to each other.

The pixel area PX may include the surface insulating layer 210, the grid pattern for the color filter grid 250, a first liner 253, the color filter CF, the micro lens ML, and a second liner 254, and the like.

The surface insulating layer 210 may be stacked on the fourth face SF2 of the second semiconductor substrate 220. The color filter grid 250, the first liner 253, the color filter CF, the micro lens ML and the second liner 254 may be disposed in an area defined by the surface insulating layer 210.

The color filter CF may be formed on the surface insulating layer 210. A respective color filter CF may correspond to each unit pixel. Each color filter CF may have a two-dimensional shape in a plan view. The color filter CF may include a red color filter, a blue color filter, and a green color filter. However, when a pixel corresponding to the pixel area PX acts as an AF pixel, the color filter CF may be implemented as the green color filter Gr1. Further, when the color filters CFs are arranged as shown in FIG. 5, the green color filters may be successively arranged in the first diagonal direction D1 and the second diagonal direction D2, so that phase difference information in the first diagonal direction D1 and the second diagonal direction D2 is precisely obtained.

The micro lens ML may be formed on the color filter CF. A respective micro lens ML may correspond to each pixel area PX, and may be disposed across each of the first to eighth photodiodes PD1 to PD8. The micro lens ML may have a convex shape with a predefined radius of curvature to condense incident light to the first to eighth photodiodes PD1 to PD8. The micro lens ML may include, e.g., light-transmissive resin. In one example, the micro lens ML of each pixel PX may cover one face of each pixel.

The color filter grid 250 may be formed in a mesh form, and may be disposed between the color filter CFs, and may define an area of each of the color filters CFs. Accordingly, at least a portion of the color filter grid 250 may overlap the pixel defining pattern 221 in the third direction Z.

The color filter grid 250 may be formed on the surface insulating layer 210. The color filter grid 250 may include, e.g., a metal pattern 251 and a low refractive index pattern 252. The metal pattern 251 and the low refractive index pattern 252 may be sequentially stacked on the surface insulating layer 210.

The first liner 253 may be formed on the surface insulating layer 210 and the color filter grid 250. The first liner 253 may extend along a surface of each of the surface insulating layer 210 and the color filter grid 250. The first liner 253 may include, e.g., aluminum oxide.

The second liner 254 may extend along a surface of the micro lens ML. The second liner 254 may be implemented as a film made of an inorganic material oxide such as silicon oxide, titanium oxide, zirconium oxide, hafnium oxide, and combinations thereof.

The pixel area PX may include a second inter-line insulating film 230 and a connection structure. The connection structure may be formed in the second inter-line insulating film 230. The connection structure may include a fourth line ML4 and a plurality of contacts (not shown) in the sensor array area SARa. The components of the pixel area PX and the components of the image sensor 100 may be electrically connected to each other via the connection structure.

In the pixel area PX, a P-type barrier PB may be formed in the second semiconductor substrate 220. Each P-type barrier PB may be spaced apart from each of the first to eighth photodiodes PD1 to PD8 by a predetermined spacing. For example, each P-type barrier PB may be disposed around each of the first to eighth photodiodes PD1 to PD8 and may surround each of the first to eighth photodiodes PD1 to PD8. For example, each of the P-type barriers PB may be spaced apart from each of the first to eighth photodiodes PD1 to PD8 in the first direction X and the second direction Y. Further, each P-type barrier PB may extend in the third direction Z and along a photoelectric conversion layer PD. Thus, each P-type barrier PB may extend vertically in the second semiconductor substrate 220. While the photoelectric conversion layer PD may be doped with an n-type impurity, the P-type barrier PB may be doped with a p-type impurity.

Further, although not shown in the drawing, the pixel area PX of the pixel array area PA may include a storage diode, a storage gate, etc., disposed adjacent to each of the first to eighth photodiodes PD1 to PD8.

The image sensor may further include a first connection structure 350, a second connection structure 450, and a third connection structure 550.

The first connection structure 350 may be formed in the light-blocking area OB. A portion of the first connection structure 350 may be formed on a portion of the surface insulating layer 210 in the light-blocking area OB. The first connection structure 350 may be in contact with the second division pattern 225. For example, a first trench 355t exposing the second division pattern 225 may be formed in the second semiconductor substrate 220 and the surface insulating layer 210 and in the light-blocking area OB. The first connection structure 350 may be formed in the first trench 355t and may contact a portion of the second division pattern 225 in the light-blocking area OB. The first connection structure 350 may extend along a profile of a side face and a bottom face of the first trench 355t.

The first connection structure 350 may be electrically connected to the second division pattern 225 to apply a ground voltage or a negative voltage to the conductive filling pattern 227. Accordingly, charges generated by ESD or the like may be discharged to the first connection structure 350 through the second division pattern 225, such that ESD bruising may be effectively prevented.

The first connection structure 350 may include a titanium (Ti) film, a titanium nitride (TiN) film, and a tungsten (W) film sequentially stacked in the first trench 355t.

A first pad 355 filling the first trench 355t may be formed on the first connection structure 350. The first pad 355 may include, e.g., at least one of tungsten (W), copper (Cu), aluminum (Al), gold (Au), silver (Ag), and alloys thereof.

The first liner 253 may cover the first connection structure 350 and the first pad 355. For example, the first liner 253 may extend along a profile of each of the first connection structure 350 and the first pad 355.

The second connection structure 450 may be formed in the connection area CR. A portion of the second connection structure 450 may be formed on a portion of the surface insulating layer 210 in the connection area CR. The second connection structure 450 may electrically connect the first substrate structure 101 and the second substrate structure 200 to each other. For example, a second trench 455t exposing the second line ML2 and the fifth line ML5 may be formed in the first substrate structure 101 and the second substrate structure 200 and in the connection area CR. The second connection structure 450 may be formed in the second trench 455t and may connect the second line ML2 and the fifth line ML5 to each other. The second connection structure 450 may extend along a profile of a side face and a bottom face of the second trench 455t.

The second connection structure 450 may include a titanium (Ti) film, a titanium nitride (TiN) film, and a tungsten (W) film that are sequentially stacked in the second trench 455t.

The first liner 253 may cover the second connection structure 450. For example, the first liner 253 may extend along a profile of the second connection structure 450.

A first filling insulating film 460 filling the second trench 455t may be formed on the second connection structure 450. The first filling insulating film 460 may include, e.g., at least one of silicon oxide, aluminum oxide, tantalum oxide, and combinations thereof.

The third connection structure 550 may be formed in the pad area PR. The third connection structure 550 may be formed on a portion of the surface insulating layer 210 in the pad area PR. The third connection structure 550 may electrically connect the first substrate structure 101 and an external device to each other.

A third trench 550t exposing the third line ML3 may be formed in the first substrate structure 101 and the second substrate structure 200 and in the pad area PR. The third connection structure 550 may be formed in the third trench 550t and contact the third line ML3.

A fourth trench 555t may be formed in a portion of the second semiconductor substrate 220 in the pad area PR. The third connection structure 550 may be formed in the fourth trench 555t and may be exposed outwardly. The third connection structure 550 may extend along a profile of a side face and a bottom face of each of the third trench 550t and the fourth trench 555t.

A second filling insulating film 560 filling the third trench 550t may be formed on the third connection structure 550. The second filling insulating film 560 may include, e.g., at least one of silicon oxide, aluminum oxide, tantalum oxide, and combinations thereof.

A second pad 555 filling the fourth trench 555t may be formed on the third connection structure 550. The second pad 555 may include, e.g., at least one of tungsten (W), copper (Cu), aluminum (Al), gold (Au), silver (Ag), and alloys thereof.

The third connection structure 550 may include a titanium (Ti) film, a titanium nitride (TiN) film, and a tungsten (W) film that are sequentially stacked in the third trench 550t.

The first liner 253 may cover the third connection structure 550. For example, the first liner 253 may extend along a profile of the third connection structure 550. The first liner 253 may expose the second pad 555.

A fourth color filter 370C may be formed on the first connection structure 350 and the second connection structure 450. For example, the fourth color filter 370C may be formed to cover a portion of the first liner 253 in each of the light-blocking area OB and the connection area CR.

The fourth color filter 370C may include, e.g., a blue color filter.

A protective film 380 may be formed on the fourth color filter 370C. For example, the protective film 380 may be formed to cover a portion of the first liner 253 in each of the light-blocking area OB, the connection area CR, and the pad area PR. The second liner 254 may extend along a surface of the protective film 380. The protective film 380 may include, e.g., light-transmissive resin. The protective film 380 may include the same material as that of the micro lens 180.

The second liner 254 and the protective film 380 may expose the second pad 555. For example, an exposure opening ER exposing the second pad 555 may be formed in the second liner 254 and the protective film 380. Accordingly, the second pad 555 may be connected to the external device such that the image sensor and the external device may transmit and receive an electrical signal to and from each other via the second pad.

Figure 9:
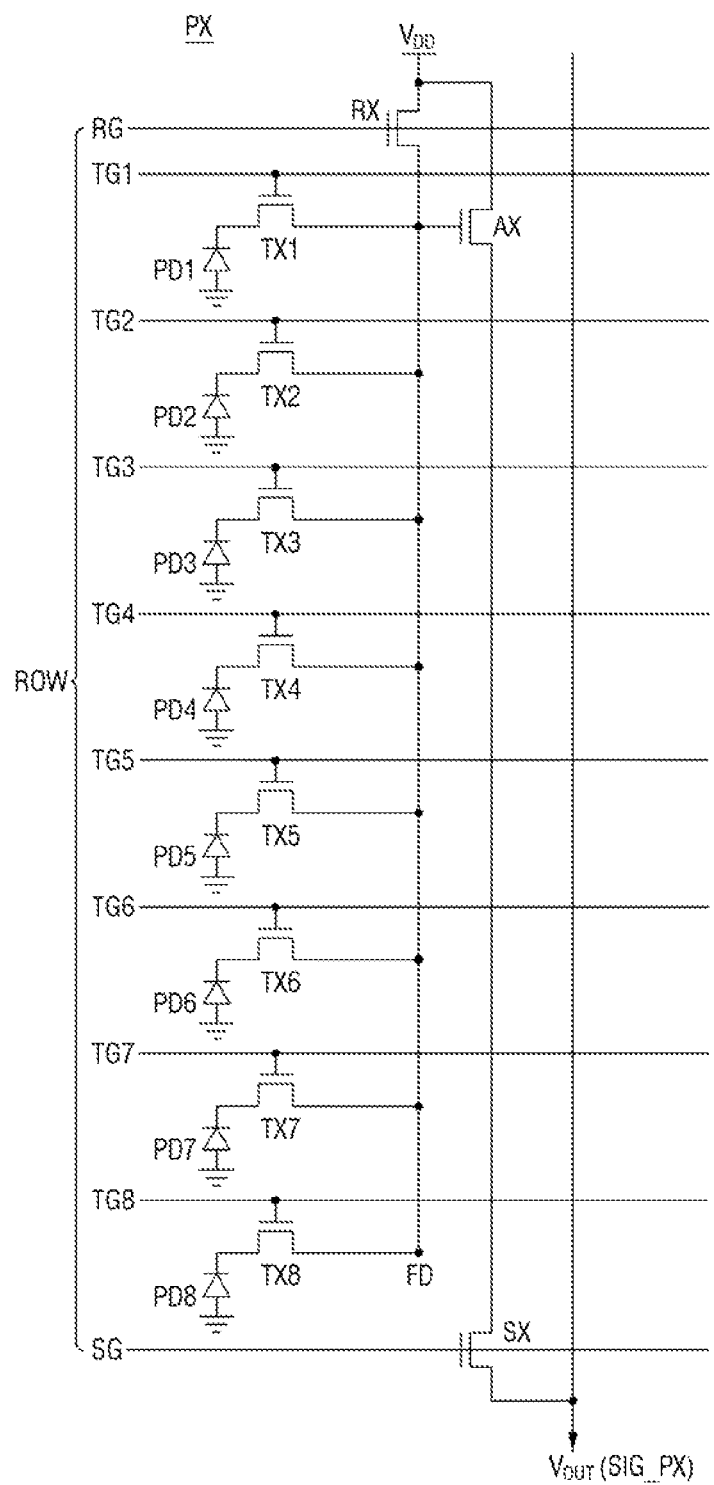
FIG. 9 is an example circuit diagram of a unit pixel of an image sensor according to an example embodiment.

FIG. 9 is an example circuit diagram of a unit pixel of an image sensor according to an example embodiment.

Referring to FIG. 9, the image sensor includes a unit pixel corresponding to the pixel area PX. Hereinafter, for convenience of description, the pixel area PX is referred to as a unit pixel PX.

A plurality of unit pixels PXs may be arranged in a matrix form along a row direction and a column direction. Each unit pixel PX may include first to eighth photodiodes PD1 to PD8, a floating diffusion area FD, and control transistors TX1 to TX8, RX, SX, and AX.

The control transistors TX1 and TX8, RX, SX, and AX may include first to eighth transfer transistors TX1 to TX8, a reset transistor RX, a select transistor SX and an amplification transistor AX. Gate electrodes of the first to eighth transfer transistors TX1 to TX8, the reset transistor RX, and the select transistor SX may be connected to driving signal lines TG1 to TG8, RG, and SG, respectively.

The driving signal lines TG1 to TG8, RG, and SG may be controlled by the row driver 1130 of FIG. 1. The driving signal lines TG1 to TG8, RG, and SG may constitute a single row line ROW.

Each unit pixel PX may include eight individual photodiodes PD1 to PD8. Each of the first to eighth photodiodes PD1 to PD8 may generate electric charges in proportion to the amount of light incident thereto from the outside. The first photodiode PD1 may be coupled to the first transfer transistor TX1, and the second photodiode PD2 may be coupled to the second transfer transistor TX2. Remaining third to eighth photodiode PD3 to PD8 may be coupled with remaining third to eighth transfer transistors TX3 to TX8, respectively.

The floating diffusion area FD converts charges into voltage. The area FD has parasitic capacitance such that charges may be stored therein in an accumulated manner. The first transfer transistor TX1 may be turned on by a first transfer line TG1 that applies a predefined bias, such that the electric charge generated from the first photodiode PD1 may be transmitted as a sensed signal to the floating diffusion area FD. The second transfer transistor TX2 may be turned on by a second transfer line TG2 that applies a predefined bias, so that the charge generated from the second photodiode PD2 may be transmitted as a sensed signal to the floating diffusion area FD. Operations of the remaining third to eighth transfer transistors TX3 to TX8 may correspond with the descriptions of the operations of the first and second transfer transistors TX1 and TX2.

The first to eighth transfer transistors TX1 to TX8 may share the floating diffusion area FD. For example, one end of the first transfer transistor TX1 may be connected to the first photodiode PD1, and the opposite end of the first transfer transistor TX1 may be connected to the floating diffusion area FD. Further, one end of the second transfer transistor TX2 may be connected to the second photodiode PD2, and the opposite end of the second transfer transistor TX2 may be connected to the floating diffusion area FD. One end of each of the remaining third to eighth transfer transistors TX3 to TX8 may be connected to each of the third to eighth photodiodes PD3 to PD8, and the opposite end thereof may be connected to the floating diffusion area FD.

The sensed signals respectively generated from the first to eighth photodiodes PD1 to PD8 may be analog-binned in the floating diffusion area FD via the first to eighth transfer lines TG1 to TG8.

The reset transistor RX may periodically reset the floating diffusion area FD. The reset transistor RX may be turned on by a reset line RG that applies a predefined bias. When the reset transistor RX is turned on, a predefined electrical potential, e.g., power voltage $V_{DD}$ provided to a drain of the reset transistor RX may be transferred to the floating diffusion area FD.

The amplification transistor AX may amplify a change in the potential of the floating diffusion area FD when the area FD has received the charges from at least one of the analog-binned sensed signals respectively generated in the first to eighth photodiodes PD1 to PD8. Then, the amplification transistor AX may output the change as an output voltage $V_{OUT}$. The amplification transistor AX may be implemented as a source follower buffer amplifier that generates a source-drain current in proportion to an amount of charge in the floating diffusion area FD. For example, a gate electrode of the amplification transistor AX may be connected to the floating diffusion area FD. Thus, a predefined electrical potential, e.g., power voltage $V_{DD}$ provided to a drain of the amplification transistor AX may be transferred to a drain of the select transistor SX.

The select transistor SX may select a unit pixel PX to be readout on a row basis. The select transistor SX may be turned on by a select line SG that applies a predefined bias. Thus, the output voltage $V_{OUT}$ of the unit pixel PX selected by the select transistor SX may be output. The output voltage $V_{OUT}$ may be an analog-binned pixel signal SIG_PX.

Figure 10:
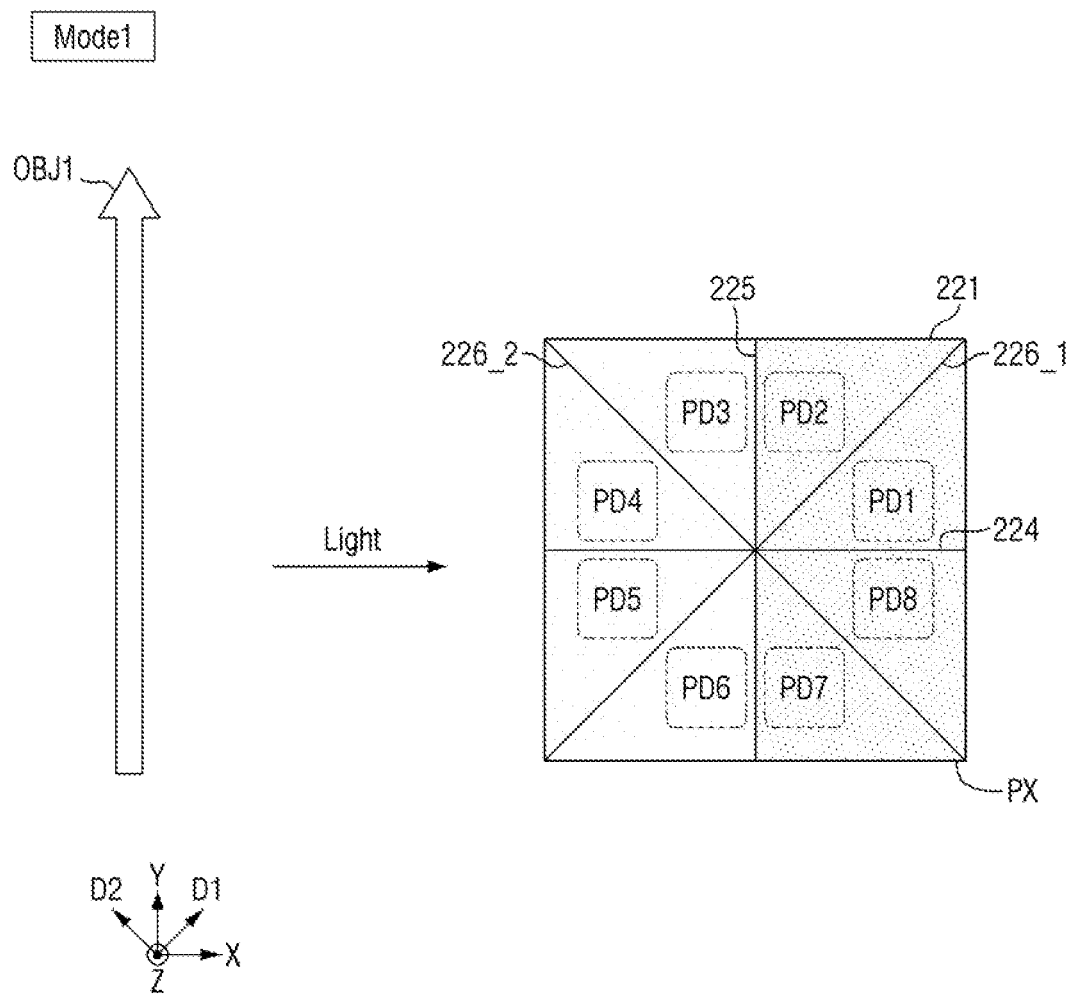
FIG. 10 and FIG. 11 are diagrams of an operation of a unit pixel of an image sensor according to an example embodiment.
Figure 11:
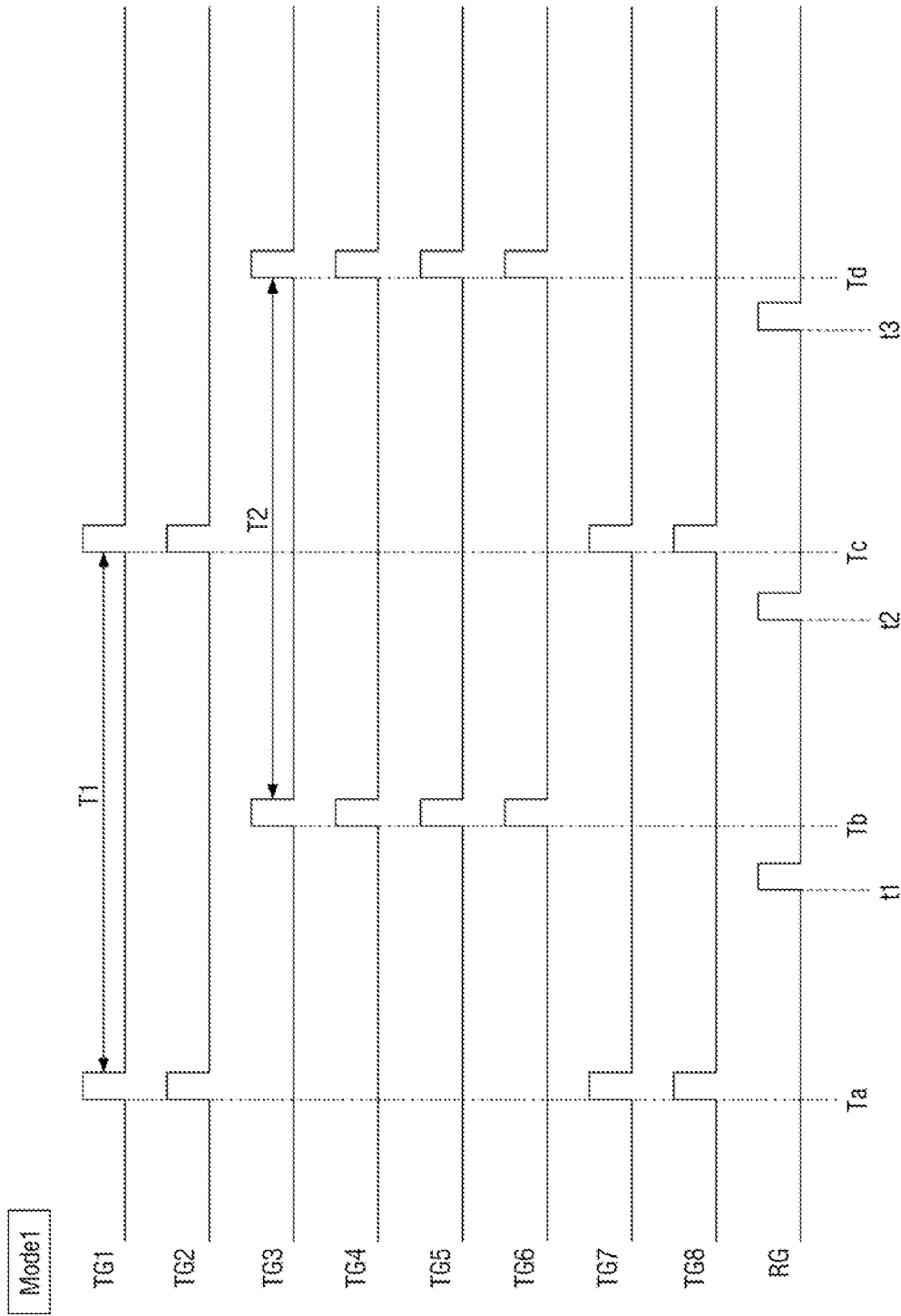

FIG. 10 and FIG. 11 are diagrams of an operation of a unit pixel of an image sensor according to an example embodiment.

Referring to FIG. 9 to FIG. 11, when a unit pixel PX performs an auto-focus (AF) function on a first object OBJ1 extending in the second direction Y, the unit pixel PX may act as an AF pixel and may perform a first operation mode Mode 1.

In the first operation mode Mode 1, an analog binning operation may be performed based on sensed signals generated from the first and second photodiodes PD1 and PD2 and the seventh and eighth photodiodes PD7 and PD8, and an analog binning operation is performed based on sensed signals generated from the third to sixth photodiode PD3 to PD6. The analog binning operation is described below with reference to FIG. 11.

Under control of the row driver 1130 in FIG. 1, the first and second transfer lines TG1 and TG2 and the seventh and eighth transfer lines TG7 and TG8 are activated on at an a-th time-point Ta. Thus, the sensed signals generated from the first and second photodiodes PD1 and PD2 and the seventh and eighth photodiodes PD7 and PD8 are subjected to the analog binning operation in the floating diffusion area FD. The unit pixel PX may output the pixel signal SIG_PX generated via the analog binning operation.

After the a-th time-point Ta, the reset control line RG may be activated at a first time-point t1, such that the reset transistor RX may be turned on, and thus the power voltage $V_{dd}$ may be applied to the floating diffusion area FD such that the area FD may be reset.

After the first time-point t1, the third to sixth transfer lines TG3 to TG6 may be activated at a b-th time-point Tb, such that the sensed signals generated from the third to sixth photodiode PD3 to PD6 are subjected to an analog binning operation in the floating diffusion area FD. The unit pixel PX may output the pixel signal SIG_PX generated via the analog binning operation.

After the b-th time-point tb, the reset control line RG may be activated at a second time-point t2 to turn on the reset transistor RX. Thus, the power voltage $V_{dd}$ is applied to the floating diffusion area FD such that the area FD is reset.

After the second time-point t2, the first and second transfer lines TG1 and TG2 and the seventh and eighth transfer lines TG7 and TG8 may be activated at a c-th time-point Tc, so that the sensed signals generated from the first and second photodiodes PD1 and PD2 and the seventh and eighth photodiodes PD7 and PD8 are subjected to an analog binning operation in the floating diffusion area FD. The unit pixel PX may output the pixel signal SIG_PX generated via the analog binning operation.

After the c-th time-point Tc, the reset control line RG may be activated at a third time-point t3, such that the reset transistor RX may be turned on, and thus the power voltage Vdd may be applied to the floating diffusion area FD such that the area FD may be reset.

After the third time-point t3, the third to sixth transfer lines TG3 to TG6 may be activated at a d-th time-point Td, such that the sensed signals generated from the third to sixth photodiodes PD3 to PD6 are subjected to an analog binning operation in the floating diffusion area FD. The unit pixel PX may output the pixel signal SIG_PX generated via the analog binning operation.

For a first exposure time duration T1 between the a-th time-point Ta and the c-th time-point Tc, the first and second photodiodes PD1 and PD2 and the seventh and eighth photodiodes PD7 and PD8 may be charged with photoelectric charges. For a second exposure time duration T2 between the b-th time-point Tb and the d-th time-point Td, the third to sixth photodiodes PD3 to PD6 may be charged with photoelectric charges.

Figure 12:
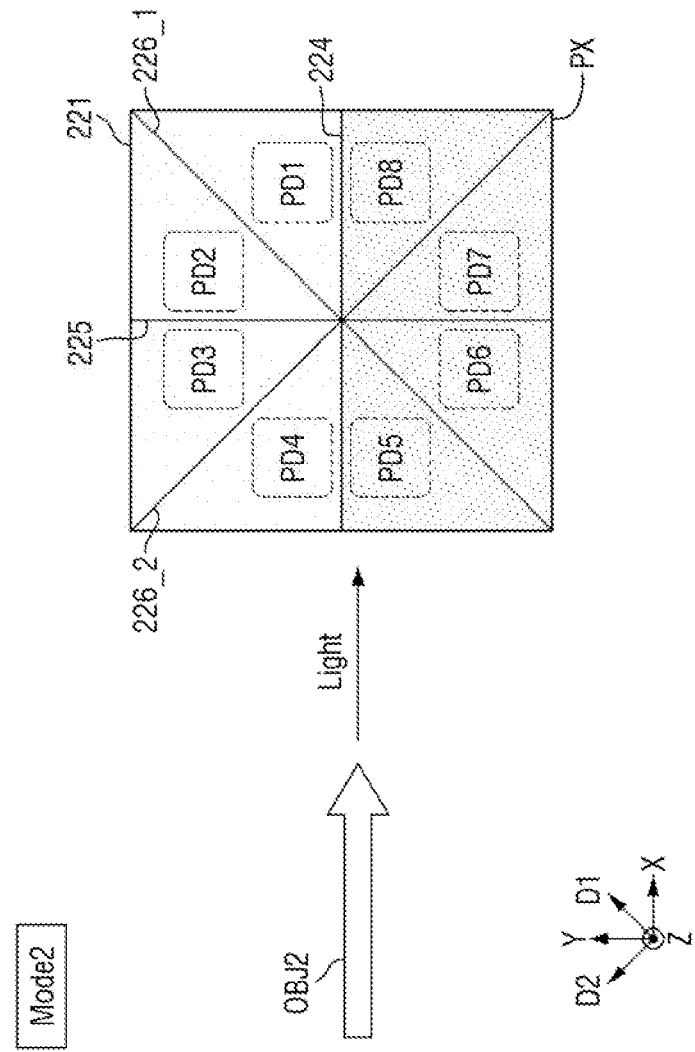
FIG. 12 to FIG. 14 are diagrams of an operation of a unit pixel of an image sensor according to an example embodiment.
Figure 13:
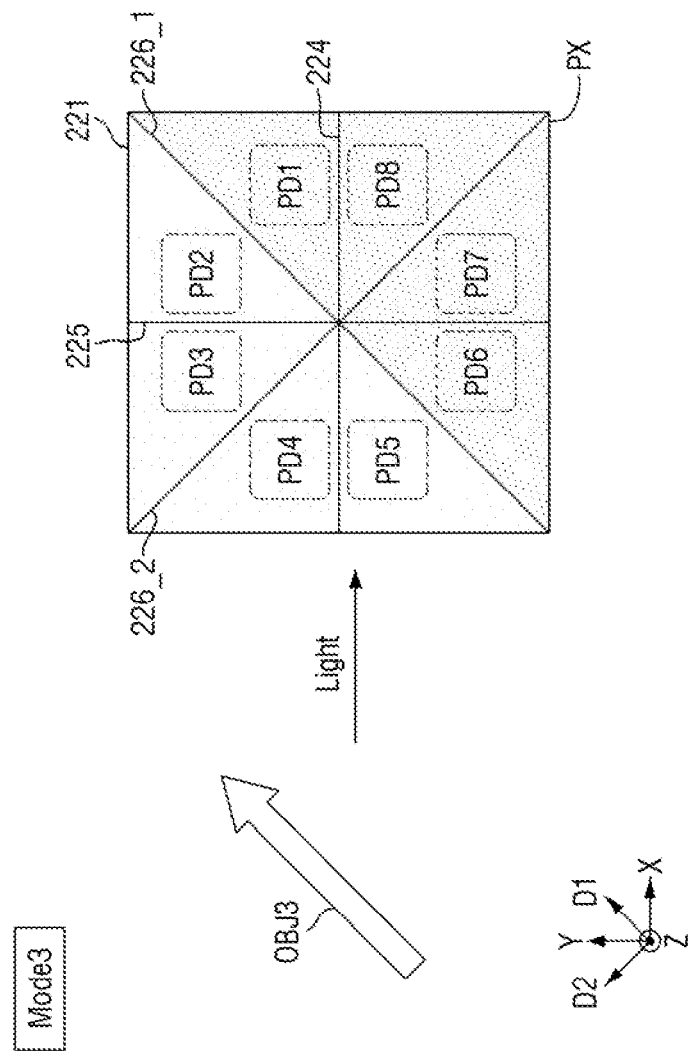
Figure 14:
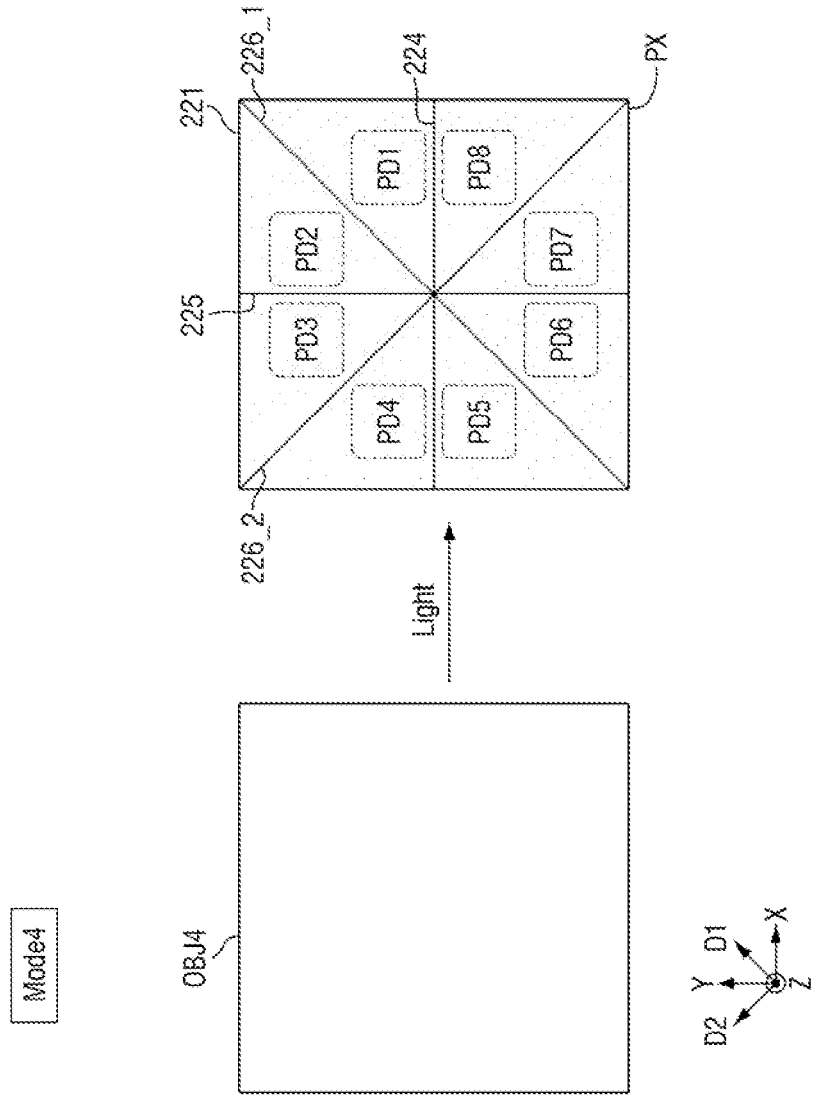

FIG. 12 to FIG. 14 are diagrams of an operation of a unit pixel of an image sensor according to an example embodiment.

Referring to FIG. 9 and FIG. 12, when a unit pixel PX performs an autofocusing (AF) function on a second object OBJ2 extending in the first direction X, the unit pixel PX may act as an AF pixel and may perform a second operation mode Mode 2.

In the second operation mode Mode 2, an analog binning operation may be performed based on sensed signals generated from the first to fourth photodiodes PD1 to PD4, and an analog binning operation may be performed based on sensed signals generated from fifth to eighth photodiodes PD5 to PD8.

As in the analog binning operation of FIG. 11, the analog binning operation of FIG. 12 may be performed such that an execution time of the analog binning operation on the sensed signal generated from the first to fourth photodiodes PD1 to PD4 is different from an execution time of the analog binning operation on the sensed signal generated from the fifth to eighth photodiodes PD5 to PD8.

Referring to FIG. 9 and FIG. 13, when the unit pixel PX performs the autofocusing (AF) function on a third object OBJ3 extending in the first diagonal direction D1, the unit pixel PX may act as an AF pixel and may perform a third operation mode Mode 3.

In the third operation mode Mode 3, an analog binning operation may be performed based on sensed signals generated from the first photodiode PD1 and the sixth to eighth photodiodes PD6 to PD8, and an analog binning operation may be performed based on sensed signals generated from the second to fifth photodiodes PD2 to PD5.

When the unit pixel PX performs the autofocusing (AF) function on an object extending in the second diagonal direction D2, an analog binning operation may be performed based on sensed signals generated from the eighth photodiode PD8 and the first to third photodiodes PD1 to PD3, and an analog binning operation may be performed based on sensed signals generated from the fourth to seventh photodiodes PD4 to PD7.

As in the analog binning operation of FIG. 11, the analog binning operation of FIG. 13 may be performed such that an execution time of the analog binning operation on the sensed signal generated from the first photodiode PD1 and the sixth to eighth photodiodes PD6 to PD8 is different from an execution time of the analog binning operation on the sensed signal generated from the second to fifth photodiodes PD2 to PD5.

Referring to FIG. 9 and FIG. 14, when the unit pixel PX performs an image detection function on a fourth object OBJ4, the unit pixel PX may act as an image detection pixel, and may perform a fourth operation mode Mode 4.

In the fourth operation mode Mode 4, an analog binning operation may be concurrently performed based on sensed signals generated from the first to eighth photodiodes PD1 to PD8.

Figure 15:
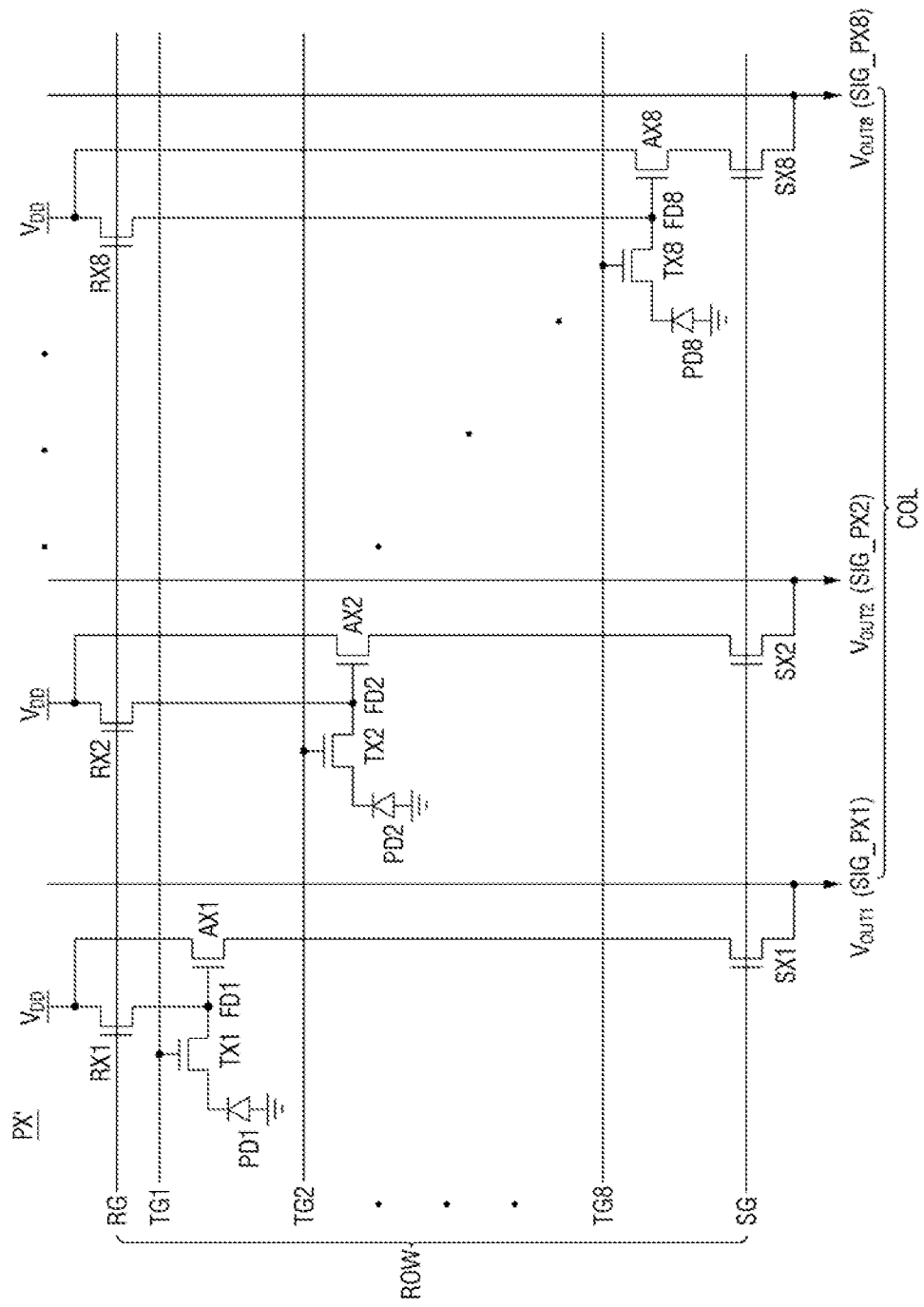
FIG. 15 is an example circuit diagram of a unit pixel of an image sensor according to another example embodiment.

FIG. 15 is an example circuit diagram of a unit pixel of an image sensor according to another example embodiment.

Hereinafter, a configuration of a unit pixel PX' according to another example embodiment will be described with reference to FIG. 15. Following descriptions are focused on differences thereof from a configuration of the unit pixel PX shown in FIG. 10.

As compared to the unit pixel PX in FIG. 10, the unit pixel PX' further includes first to eighth reset transistors RX1 to RX8, first to eighth select transistors SX1 to SX8, first to eighth amplification transistors AX1 to AX8, and first to eighth floating diffusion areas FD1 to FD8.

Each of the first to eighth reset transistors RX1 to RX8, each of the first to eighth select transistors SX1 to SX8, each of the amplification transistors AX1 to AX8, and each of the first to eighth floating diffusion areas FD1 to FD8 may respectively correspond to the reset transistor RX, the select transistor SX, the amplification transistor AX, and the floating diffusion area FD in FIG.

Each of the first to eighth transfer transistors TX1 to TX8 may be turned on by each of the first to eighth transfer lines TG1 to TG8 that applies a predefined bias, such that electric charges generated from each of the first to eighth photodiodes PD1 to PD8 may be transmitted, as each of first to eighth sensed signals, to each of the first to eighth floating diffusion areas FD1 to FD8.

Each of the first to eighth transfer transistors TX1 to TX8 may be coupled to each of the first to eighth floating diffusion areas FD1 to FD8. The first to eighth floating diffusion areas FD1 to FD8 may be separated from each other.

Each of the first to eighth reset transistors RX1 to RX8 may periodically reset each of the first to eighth floating diffusion areas FD1 to FD8. The first to eighth reset transistors RX1 to RX8 may be turned on by a reset line RG that applies a predefined bias. When the first to eighth reset transistors RX1 to RX8 are turned on, a predefined electrical potential, e.g., a power voltage $V_{DD}$ provided to a drain of each of the first to eighth reset transistors RX1 to RX8 may be transferred to each of the first to eighth floating diffusion areas FD1 to FD8.

Each of the first to eighth amplification transistors AX1 to AX8 may amplify a change in the potential of each of the first to eighth floating diffusion areas FD1 to FD8 when each of the first to eighth floating diffusion areas FD1 to FD8 has received the charges from each of the first to eighth sensed signals generated from each of the first to eighth photodiodes PD1 to PD8. Then, each of the first to eighth amplification transistors AX1 to AX8 may output each amplified change as each of first to eighth output voltages $V_{OUT1}$ to $V_{OUT8}$. Each of the first to eighth amplification transistors AX1 to AX8 may be implemented as a source follower buffer amplifier that generates a source-drain current in proportion to a charge amount of each of the first to eighth floating diffusion areas FD1 to FD8. For example, a gate electrode of each of the first to eighth amplification transistors AX1 to AX8 may be connected to each of the first to eighth floating diffusion areas FD1 to FD8. Thus, a predefined electrical potential, e.g., a power voltage $V_{DD}$ provided to a drain of each of the first to eighth amplification transistors AX1 to AX8 may be delivered to a drain of each of the first to eighth select transistors SX1 to SX8.

Each of the first to eighth select transistors SX1 to SX8 may select a unit pixel PX' to be readout on a row basis. Each of the first to eighth select transistors SX1 to SX8 may be turned on by a select line SG that applies a predefined bias. Thus, each of the first to eighth output voltages $V_{OUT1}$ to $V_{OUT8}$ of the unit pixel PX' selected by each of the first to eighth select transistors SX1 to SX8 may be output. Each of the first to eighth output voltages $V_{OUT1}$ to $V_{OUT8}$ may be each of first to eighth pixel signals SIG_PX1 to SIG_PX8.

The first to eighth pixel signals SIG_PX1 to SIG_PX8 may be output to one column line COL. The first to eighth pixel signals SIG_PX1 to SIG_PX8 may be individually output from the unit pixel PX', and may be input to the readout circuit 1150 in FIG. 1 at the same time.

Figure 16:
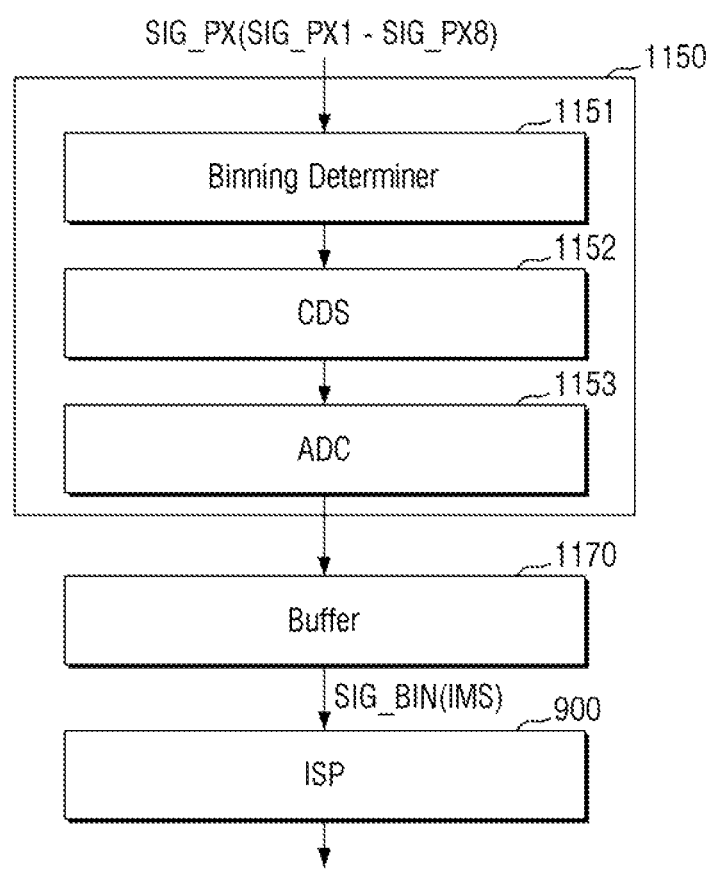
FIG. 16 is a diagram of an operation of an image sensing system according to another example embodiment.

FIG. 16 is a diagram of an operation of an image sensing system according to another example embodiment. FIG. 16 illustrates an operation of the image sensing system including the unit pixel PX' in FIG. 15.

Referring to FIG. 1, FIG. 15 and FIG. 16, the readout circuit 1150 may include a binning determiner 1151, a correlated double sampler (CDS) 1152, and an analog-digital converter 1153.

The binning determiner 1151 may receive the pixel signals SIG_PX output from the unit pixel PX'. The pixel signals SIG_PX may include the first to eighth pixel signals SIG_PX1 to SIG_PX8. The binning determiner 1151 may determine whether to perform a binning operation on the pixel signals SIG_PX.

The binning determiner 1151 may determine performing the binning operation according to an operation mode of the unit pixel PX'. The binning determiner 1151 may perform an analog binning operation on the first to eighth pixel signals SIG_PX1 to SIG_PX8 as the pixel signals SIG_PX to output an image signal IMS as a binned image signal SIG_BIN.

When the unit pixel PX' performs the autofocusing (AF) function on the first object OBJ1 extending in the second direction Y as in the first operation mode Mode 1 in FIG. 10, the binning determiner 1151 may determine to perform a first analog binning operation based on first and second pixel signals SIG_PX1 and SIG_PX2 and seventh and eighth pixel signals SIG_PX7 and SIG_PX8 respectively generated from first and second photodiodes PD1, PD2 and the seventh and eighth photodiodes PD7 and PD8, and to perform a second analog binning operation based on third to sixth pixel signals SIG_PX3 to SIG_PX6 generated respectively from the third to sixth photodiodes PD3 to PD6.

When the unit pixel PX' performs the autofocusing (AF) function on the second object OBJ2 extending in the first direction X as in the second operation mode Mode 2 in FIG. 12, the binning determiner 1151 may determine to perform a first analog binning operation based on the first to fourth pixel signals SIG_PX1 to SIG_PX4 generated respectively from the first to fourth photodiodes PD1 to PD4, and to perform a second analog binning operation based on the fifth to eighth pixel signals SIG_PX5 to SIG_PX8 generated respectively from the fifth to eighth photodiodes PD5 to PD8.

When the unit pixel PX' performs the autofocusing (AF) function on the third object OBJ3 extending in the first diagonal direction D1 as in the third operation mode Mode 3 in FIG. 13, the binning determiner 1151 may determine to perform a first analog binning operation based on the first pixel signal SIG_PX1 and the sixth to eighth pixel signals SIG_PX6 to SIG_PX8 generated respectively from the first photodiode PD1 and the sixth to eighth photodiodes PD6 to PD8, and to perform a second analog binning operation based on the second to fifth pixel signals SIG_PX2 to SIG_PX5 generated respectively from the second to fifth photodiodes PD2 to PD5.

When the unit pixel PX' performs the image detection function on the fourth object OBJ4 as in the fourth operation mode Mode 4 of FIG. 14, the binning determiner 1151 may determine to perform an analog binning operation based on the first to eighth pixel signals SIG_PX1 to SIG_PX8 generated respectively from the first to eighth photodiodes PD1 to PD8.

Figure 17:
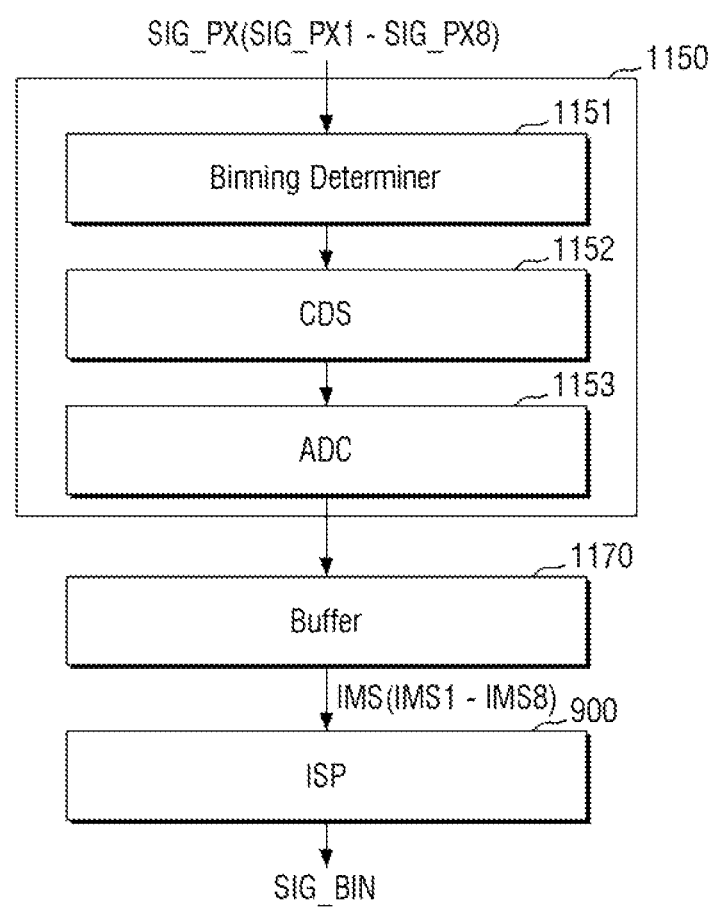
FIG. 17 is a diagram of an operation of an image sensing system according to another example embodiment.

FIG. 17 is a diagram of an operation of an image sensing system according to another example embodiment. FIG. 17 illustrates the operation of the image sensing system including the unit pixel PX' in FIG. 15.

Referring to FIG. 1, FIG. 15, and FIG. 17, the buffer 1170 may receive first to eighth image signals IMS corresponding to the first to eighth pixel signals SIG_PX1 to SIG_PX8 from the readout circuit 1150, and deliver the first to eighth image signals IMS to the image signal processor 900. The image signal processor 900 may perform a digital binning operation on the first to eighth image signals IMS to generate a binned image signal SIG_BIN.

The image signal processor 900 may determine performing the binning operation according to the operation mode of the unit pixel PX'. Thus, the image signal processor 900 may perform a digital binning operation on first to eighth image signals IMS corresponding to the first to eighth pixel signals SIG_PX1 to SIG_PX8 to output a binned image signal SIG_BIN.

When the unit pixel PX' performs the autofocusing (AF) function on the first object OBJ1 extending in the second direction Y, as in the first operation mode Mode 1 in FIG. 10, the image signal processor 900 may perform a first digital binning operation on first and second image signals IMS1 and IMS2 and seventh and eighth image signals IMS7 and IMS8 respectively based on the first and second pixel signals SIG_PX1 and SIG_PX2 and the seventh and eighth pixel signals SIG_PX7 and SIG_PX8, and perform a second digital binning operation third to sixth image signals IMS3 to IMS6 respectively based on the third to sixth pixel signals SIG_PX3 to SIG_PX6.

When the unit pixel PX' performs the autofocusing (AF) function on the second object OBJ2 extending in the first direction X, as in the second operation mode Mode 2 in FIG. 12, the image signal processor 900 may perform a first digital binning operation on the first to fourth image signals IMS1 to IMS4 respectively based on the first to fourth pixel signals SIG_PX1 to SIG_PX4, and perform a second digital binning operation on the fifth to eighth image signal IMS5 to IMS8 respectively based on the fifth to eighth pixel signals SIG_PX5 to SIG_PX8.

When the unit pixel PX' performs the autofocusing (AF) function on the third object OBJ3 extending in the first diagonal direction D1, as in the third operation mode Mode 3 in FIG. 13, the image signal processor 900 may perform a first digital binning operation on the first and sixth to eighth image signals IMS1 and IMS6 to IMS8 respectively based on the first pixel signal SIG_PX1 and the sixth to eighth pixel signals SIG_PX6 to SIG_PX8, and perform a second digital binning operation on the second to fifth image signals IMS2 to IMS5 respectively based on the second to fifth pixel signals SIG_PX2 to SIG_PX5.

When the unit pixel PX' performs the image detection function on the fourth object OBJ4, as in the fourth operation mode Mode 4 of FIG. 14, the image signal processor 900 may perform a digital binning operation on the first to eighth image signals IMS1 to IMS8 respectively based on the first to eighth pixel signals SIG_PX1 to SIG_PX8.

An image sensing system according to an example embodiment may efficiently and quickly perform the autofocusing operation on the diagonal directions in the third operation mode Mode 2 of each of the unit pixel PX and the unit pixel PX'.

An image sensing system according to an example embodiment may provide a dual pixel that may efficiently perform the autofocusing operation on various directions, and may efficiently perform the image detection operation in the first to fourth operation modes Mode 1 to Mode 4 of each of the unit pixel PX and the unit pixel PX'.

Figure 18:
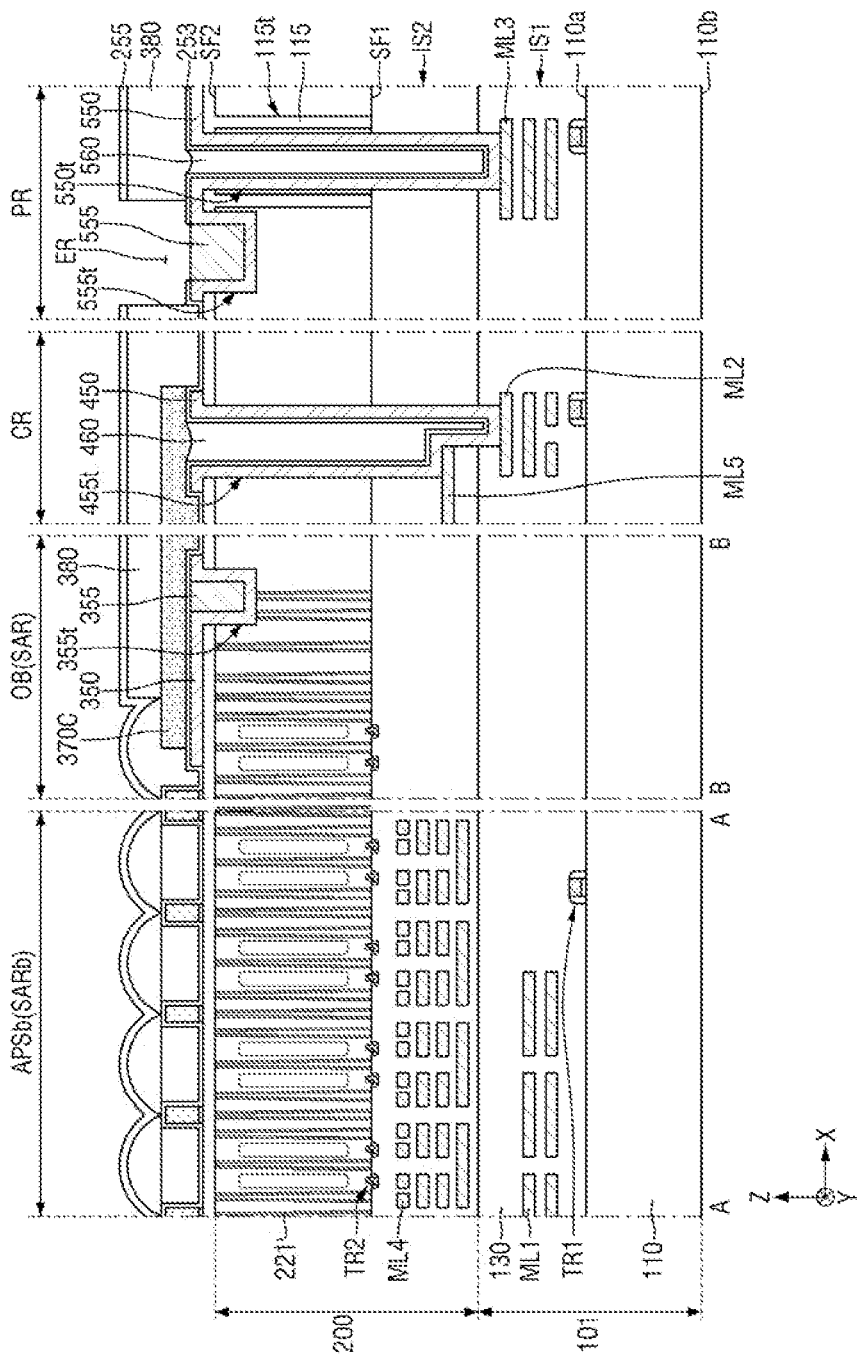
FIG. 18 is a diagram of an image sensor according to another example embodiment.

FIG. 18 is a diagram of an image sensor according to another example embodiment.

Hereinafter, an image sensor according to another example embodiment will be described with reference to FIG. 18. The following description will be focused on differences thereof from the image sensor shown in FIG. 7.

As compared to the pixel defining pattern 221 in FIG. 7, a width of a pixel defining pattern 221' in FIG. 18 decreases as the pixel defining pattern 221' extends in a direction from the third face SF1 of the second semiconductor substrate 220 toward the fourth face SF2 of the second semiconductor substrate 220.

The structure of the pixel defining pattern 221' may be formed using characteristics of an etching process that forms the pixel defining pattern 221'. For example, the process of etching the second semiconductor substrate 220 to form the pixel defining pattern 221' may be performed on the third face SF1 of the second semiconductor substrate 220.

Figure 19:
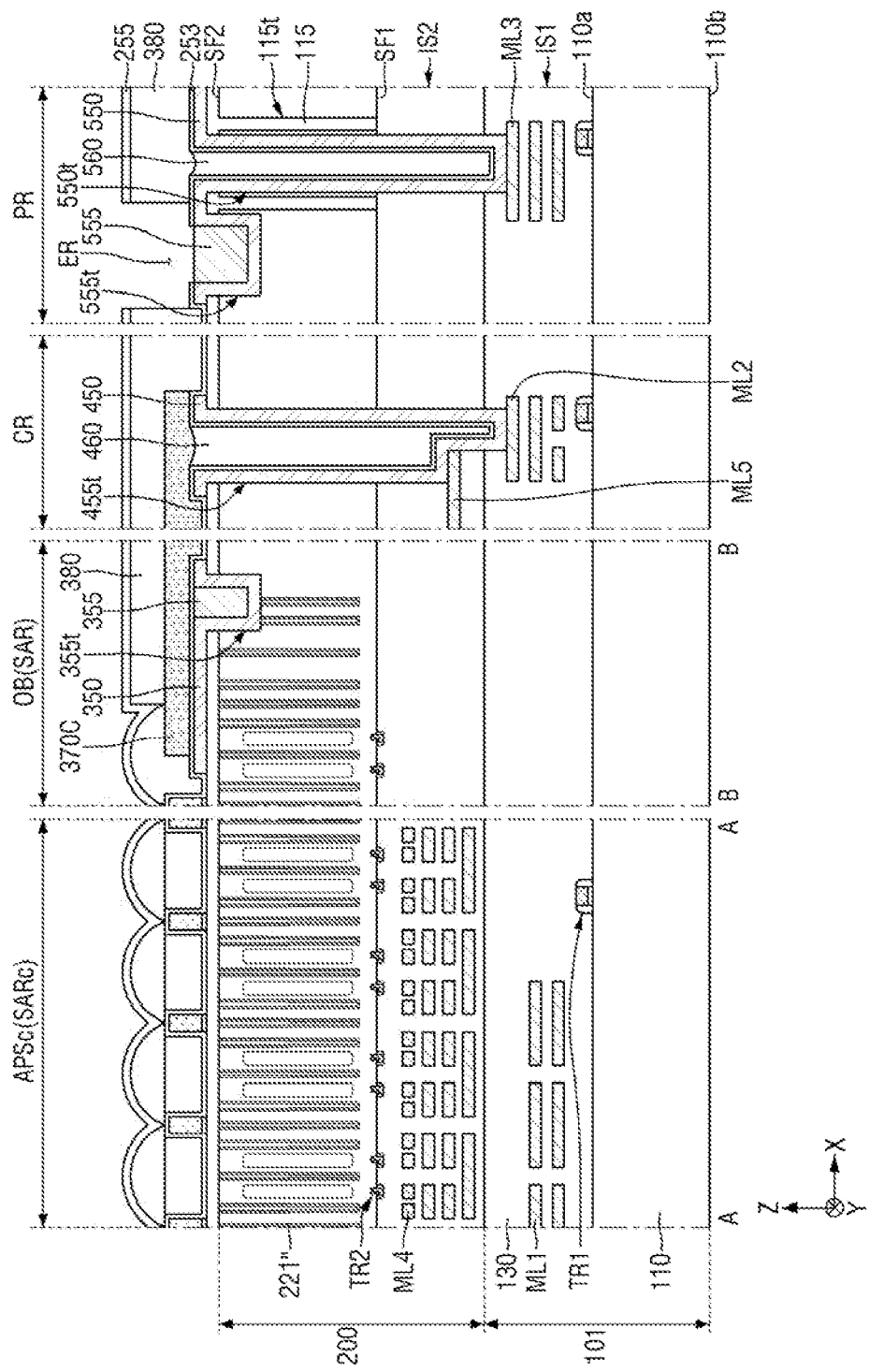
FIG. 19 is a diagram of an image sensor according to another example embodiment.

FIG. 19 is a diagram of an image sensor according to another example embodiment.

Hereinafter, an image sensor according to another example embodiment will be described with reference to FIG. 19. The following description will be focused on differences thereof from the image sensors shown in FIG. 18.

As compared to the pixel defining pattern 221' in FIG. 18, a width of a pixel defining pattern 221" in FIG. 19 decreases as the pixel defining pattern 221" extends in a direction from the fourth face SF2 of the second semiconductor substrate 220 toward the third face SF1 of the second semiconductor substrate 220.

The structure of the pixel defining pattern 221" may be formed using characteristics of an etching process that forms the pixel defining pattern 221". For example, the process of etching the second semiconductor substrate 220 to form the pixel defining pattern 221" may be performed on the fourth face SF2 of the second semiconductor substrate 220.

The pixel defining pattern 221" may not completely extend through the second semiconductor substrate 220. For example, the pixel defining pattern 221" may extend from the fourth face SF2 of the second semiconductor substrate 220, but may not reach the third face SF1 of the second semiconductor substrate 220. Thus, the lowermost face of the pixel defining pattern 221″ may be spaced apart from the third face SF1 of the second semiconductor substrate 220.

Figure 20:
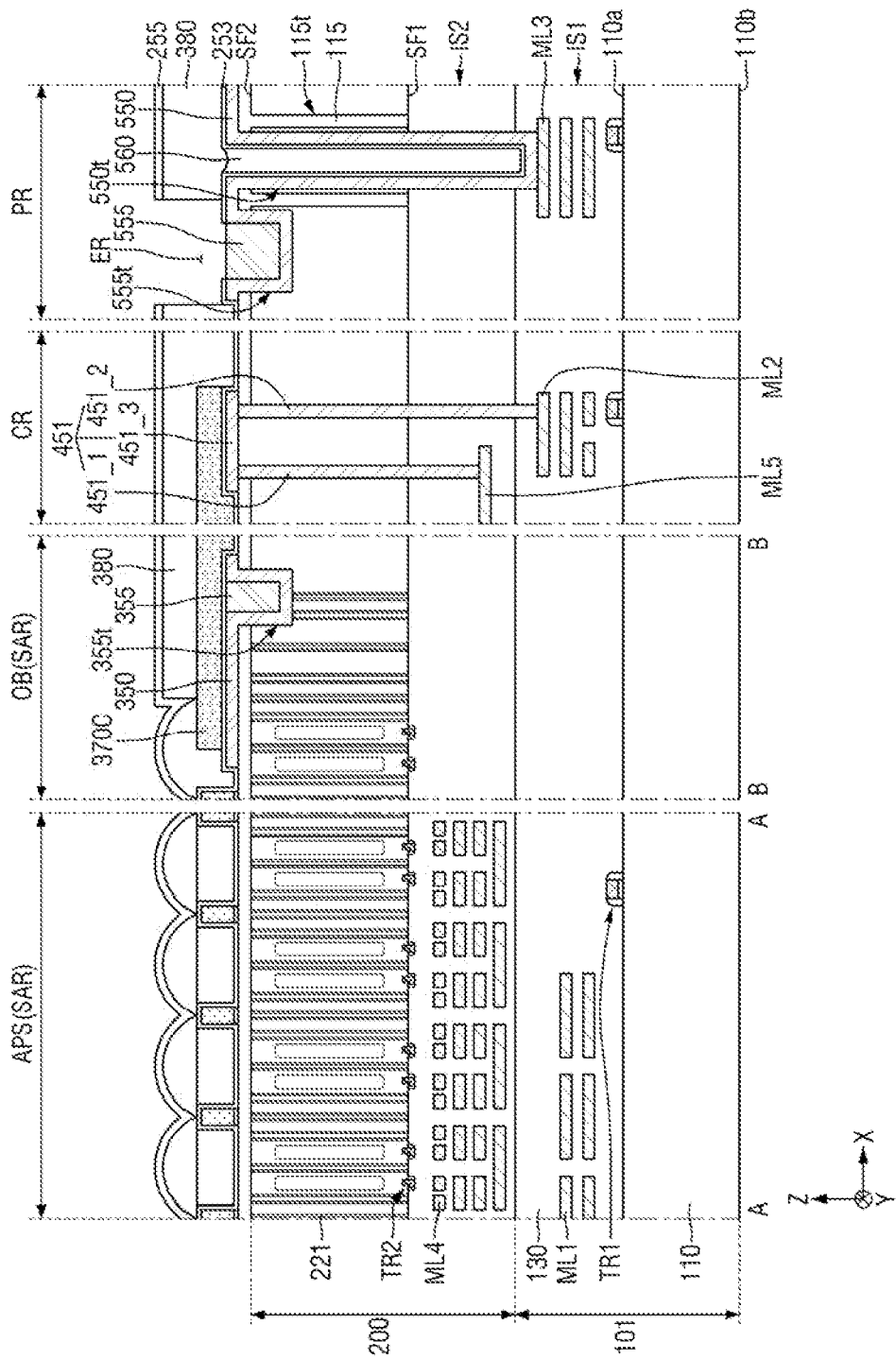
FIG. 20 is a diagram of an image sensor according to another example embodiment.

FIG. 20 is a diagram of an image sensor according to another example embodiment.

Hereinafter, an image sensor according to another example embodiment will be described with reference to FIG. 20. The following description will be focused on differences thereof from the image sensor shown in FIG. 7.

The image sensor in FIG. 20 may include a connection pattern 451 instead of the second connection structure 450 in the connection area CR. The connection pattern 451 may include a first connection pattern 451_1, a second connection pattern 451_2, and a third connection pattern 451_3.

The first connection pattern 451_1 may extend through the surface insulating layer 210, the second semiconductor substrate 220, and the second inter-line insulating film 230 in the third direction Z, and may be connected to the fifth line ML5 in the connection area CR.

The second connection pattern 451_2 may extend through the surface insulating layer 210, the second semiconductor substrate 220, the second inter-line insulating film 230, and the first inter-line insulating film 130 in the third direction Z, and may be connected to the second line ML2 in the connection area CR.

The second connection pattern 451_2 may be spaced apart from the first connection pattern 451_1. A portion of each of the surface insulating layer 210, the second semiconductor substrate 220, and the second inter-line insulating film 230 may be disposed between the first connection pattern 451_1 and the second connection pattern 451_2.

The third connection pattern 451_3 may be disposed on a top face of the surface insulating layer 210. The third connection pattern 451_3 may connect the first connection pattern 451_1 and the second connection pattern 451_2 to each other.

Figure 21:
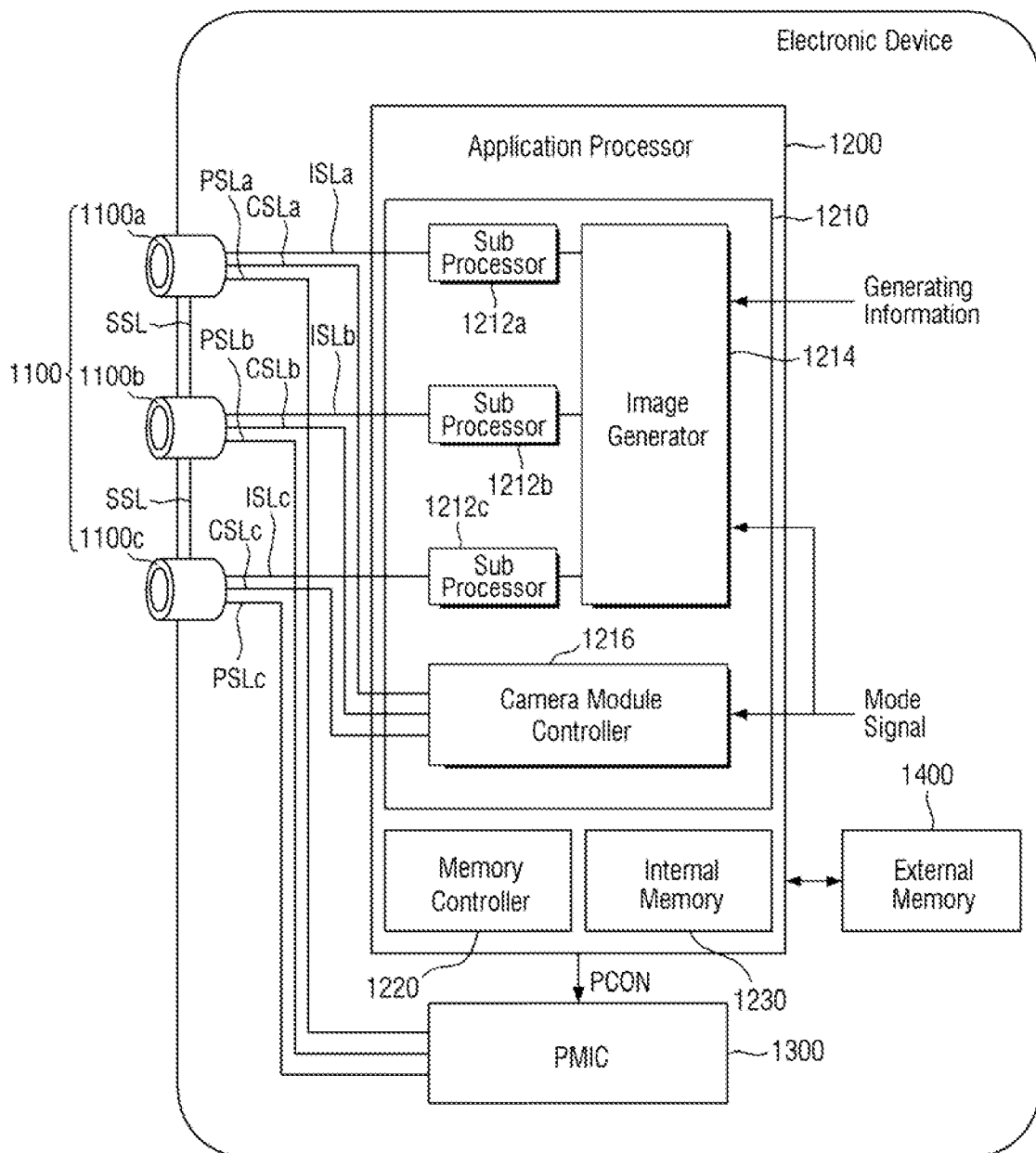
FIG. 21 is a block diagram showing an electronic device including a multi-camera module according to an example embodiment.
Figure 22:
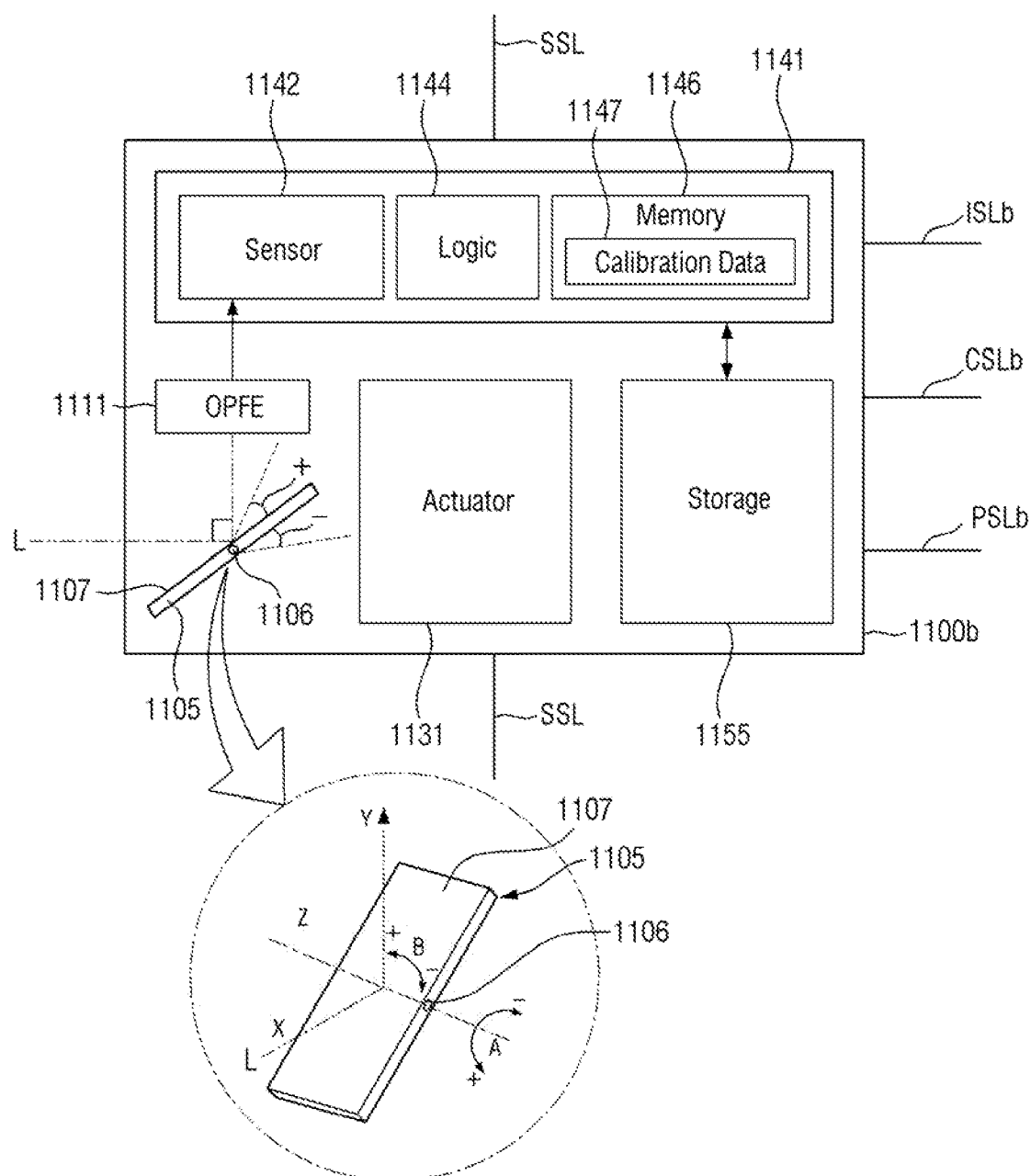
FIG. 22 is a detailed block diagram of a camera module of FIG. 21.

FIG. 21 is a block diagram showing an electronic device including a multi-camera module according to an example embodiment. FIG. 22 is a detailed block diagram of a camera module of FIG. 21.

Hereinafter, referring to FIG. 21 and FIG. 22, an electronic device 1000 according to another example embodiment will be described. For convenience of descriptions, duplicate descriptions to those with reference to FIG. 1 to FIG. 20 are briefly made or omitted.

Referring to FIG. 21, the electronic device 1000 may include a camera module group 1100, an application processor 1200, a PMIC 1300, and an external memory 1400.

The camera module group 1100 may include a plurality of camera modules 1100a, 1100b, and 1100c. Although FIG. 21 shows an embodiment in which three camera modules 1100a, 1100b, and 1100c are arranged, the camera module group 1100 may be modified to include, e.g., only two camera modules, or four or more camera modules.

One of the three camera modules 1100a, 1100b, and 1100c may include the image sensor 100 described using FIG. 1 to FIG. 20.

Hereinafter, with reference to FIG. 22, a detailed configuration of the camera module 1100b will be described in more detail. However, the following description may be equally applied to other camera modules 1100a and 1100c according to embodiments.

Referring to FIG. 22, the camera module 1100b may include a prism 1105, an optical path folding element (OPFE) 1111, an actuator 1131, an image sensing device 1141, and a storage 1155.

The prism 1105 may include a reflective face 1107 made of a reflective material, and may modify a path of light L that is incident from an outside. For example, the prism 1105 may change the path of the light L such that the light incident thereto in the first direction X is output therefrom in a second direction Y perpendicular to the first direction X. Further, the prism 1105 may rotate the reflective face 1107 of the reflective material in an A direction about a central axis 1106 or may rotate the central axis 1106 in a B direction so that the light incident thereto in the first direction X is output therefrom in the second direction Y perpendicular to the first direction X. The OPFE 1111 may move in a third direction Z normal to a plane defined by the first direction X and the second direction Y. In an implementation, a maximum rotation angle in the A direction of the prism 1105 may be smaller than or equal to 15 degrees in a plus (+) A direction, and may be greater than 15 degrees in a minus (−) A direction. The prism 1105 may move by a range of, e.g., around 20 degrees, or between 10 and 20 degrees, or between 15 and 20 degrees in the plus (+) or minus (−) B direction. The prism 1105 may move by the same angle in the plus (+) and minus (−) B directions. In another implementation, angles by which the prism 1105 may move in the plus (+) and minus (−) B directions, respectively may have a difference of about 1 degree therebetween. The prism 1105 may move the reflective face 1107 made of the light reflective material in the third direction, e.g., the Z direction parallel to an extension direction of the central axis 1106.

The OPFE 1111 may include a group of m optical lenses (m being a natural number). The group of m optical lenses may move in the second direction Y to change an optical zoom ratio of the camera module 1100b. For example, a basic optical zoom ratio of the camera module 1100b may be Z. When the m optical lenses included in the OPFE 1111 move, the optical zoom ratio of the camera module 1100b may be changed to an optical zoom ratio equal to or higher than 3Z or 5Z.

The actuator 1131 may move the OPFE 1111 or the optical lens to a specific position. For example, the actuator 1131 may adjust a position of the optical lens so that the image sensor 1142 is located at a focal length of the optical lens for accurate sensing.

The image sensing device 1141 may include an image sensor 1142, a control logic 1144 and a memory 1146. The image sensor 1142 may sense an image of a sensing target using the light L provided through the optical lens. The control logic 1144 may control all of operations of the camera module 1100b. For example, the control logic 1144 may control an operation of the camera module 1100b based on a control signal provided through a control signal line CSLb.

The memory 1146 may store therein information used for operation of the camera module 1100b, such as calibration data 1147. The calibration data 1147 may include information used when the camera module 1100b generates image data using the light L provided from the outside. The calibration data 1147 may include, e.g., information about a degree of rotation, information about a focal length, information about an optical axis, and the like. When the camera module 1100b is implemented in a multi-state camera form in which the focal length varies based on a position of the optical lens, the calibration data 1147 may include a focal length value based on each position (or each state) of the optical lens, and information related to auto focusing.

The storage 1155 may store therein image data sensed via the image sensor 1142. The storage 1155 may be disposed outside the image sensing device 1141, and may be implemented to be stacked on a sensor chip constituting the image sensing device 1141. The storage 1155 may be implemented as an EEPROM (Electrically Erasable Programmable Read-Only Memory).

Referring to FIG. 21 and FIG. 22 together, each of the plurality of camera modules 1100a, 1100b, and 1100c may include a respective actuator 1131. Accordingly, each of the plurality of camera modules 1100a, 1100b, and 1100c may include the same or different calibration data 1147 based on an operation of the actuator 1131 included therein.

One camera module (e.g., 1100b) among the plurality of camera modules 1100a, 1100b, and 1100c may be a camera module in a folded lens form including the prism 1105 and the OPFE 1111 as described above, while each of the remaining camera modules (e.g., 1100a and 1100c) may be a vertical-type camera module that does not include the prism 1105 and the OPFE 1111.

One camera module (e.g., 1100c) among the plurality of camera modules 1100a, 1100b, and 1100c, may be a depth camera of a vertical form that extracts depth information, e.g., using IR (Infrared Ray). In this case, the application processor 1200 may merge image data provided from the depth camera and image data provided from another camera module (e.g., 1100a or 1100b) to generate a three-dimensional depth image (3D depth image).

At least two camera modules (e.g., 1100a and 1100b) among the plurality of camera modules 1100a, 1100b, and 1100c may have different fields of view (FOVs). In this case, e.g., at least two of the plurality of camera modules 1100a, 1100b, and 1100c, e.g., optical lenses of at least two (e.g., 1100a and 1100b) of the plurality of camera modules 1100a, 1100b, and 1100c may be different from each other. FOVs of the plurality of camera modules 1100a, 1100b, and 1100c may be different from each other. In this case, the optical lenses respectively included in the plurality of camera modules 1100a, 1100b, and 1100c may also be different from each other.

The plurality of camera modules 1100a, 1100b, and 1100c may be physically separated from each other. Thus, instead of a structure in which a sensing area of one image sensor 1142 is divided into a plurality of sub-areas which correspond to the plurality of camera modules 1100a, 1100b, and 1100c, an individual image sensor 1142 may be disposed in each of the plurality of camera modules 1100a, 1100b, and 1100c.

Referring to FIG. 21, the application processor 1200 may include an image processing device 1210, a memory controller 1220, and an internal memory 1230. The application processor 1200 may be implemented to be separated from the plurality of camera modules 1100a, 1100b, and 1100c. For example, the application processor 1200 and the plurality of camera modules 1100a, 1100b, and 1100c may be implemented as separate semiconductor chips.

The image processing device 1210 may include a plurality of auxiliary image processors 1212a, 1212b, and 1212c, an image generator 1214 and a camera module controller 1216. The number of the auxiliary image processors 1212a, 1212b, and 1212c may correspond to the number of camera modules 1100a, 1100b, and 1100c. Image data generated from each of the camera modules 1100a, 1100b, and 1100c may be provided to each of the auxiliary image processors 1212a, 1212b, and 1212c via each of image signal lines ISLa, ISLb, and ISLc separated from each other. For example, the image data generated from the camera module 1100a may be transmitted to the auxiliary image processor 1212a via the image signal line ISLa. The image data generated from the camera module 1100b may be transmitted to the auxiliary image processor 1212b via the image signal line ISLb. The image data generated from the camera module 1100c may be transmitted to the auxiliary image processor 1212c via the image signal line ISLc. The image data transmission may be performed, e.g., using a camera serial interface (CSI) based on a Mobile Industry Processor Interface (MIPI).

One auxiliary image processor may correspond to a plurality of camera modules. For example, the auxiliary image processor 1212a and the auxiliary image processor 1212c may not be implemented separately from each other, but may be integrated into one auxiliary image processor. The image data provided from the camera module 1100a and the camera module 1100c may be selected via a selection element, e.g., a multiplexer, and then may be provided to the integrated auxiliary image processor.

The image data provided to each of the auxiliary image processors 1212a, 1212b, and 1212c may be provided to the image generator 1214. The image generator 1214 may generate an output image using the image data provided from each of the auxiliary image processors 1212a, 1212b, and 1212c and based on image generation information or a mode signal. The image generator 1214 may merge at least a portion of the image data generated from the camera modules 1100a, 1100b, and 1100c having different FOVs, based on the image generation information or the mode signal, and thus may generate the output image as the merging result. The image generator 1214 may select one of the image data generated from the camera modules 1100a, 1100b, and 1100c having different FOVs, and based on the image generation information or the mode signal and thus may generate the output image as the selected data.

The image generation information may include a zoom signal or a zoom factor. The mode signal may be, e.g., a signal based on a mode selected by a user. When the image generation information is the zoom signal or the zoom factor, and the camera modules 1100a, 1100b, and 1100c have different FOVs, the image generator 1214 may perform different operations based on types of the zoom signal. For example, when the zoom signal is a first signal, the image generator may merge the image data output from the camera module 1100a and the image data output from the camera module 1100c with each other, and generate the output image using the merged image data, and the image data output from the camera module 1100b not used in the merging operation. When the zoom signal is a second signal different from the first signal, the image generator 1214 may not perform such an image data merging operation, but may select one of the image data output from the camera modules 1100a, 1100b, and 1100c and may generate the selected data as the output image.

The image generator 1214 may receive a plurality of image data having different exposure times from at least one of the plurality of auxiliary image processors 1212a, 1212b, and 1212c, and may perform HDR (high dynamic range) processing on the received plurality of image data, thereby generating merged image data having an increased dynamic range.

The camera module controller 1216 may provide a control signal to each of the camera modules 1100a, 1100b, and 1100c. The control signal generated from the camera module controller 1216 may be provided to a corresponding one of the camera modules 1100a, 1100b, and 1100c via a corresponding one of the control signal lines CSLa, CSLb, and CSLc separated from each other.

One of the plurality of camera modules 1100a, 1100b, and 1100c may be designated as a master camera (e.g., 1100b) based on the image generation information including the zoom signal or the mode signal, while each of the remaining camera modules (e.g., 1100a and 1100c) may be designated as a slave camera. This designation information may be included in the control signal and may be provided to a corresponding one of the camera modules 1100a, 1100b, and 1100c via a corresponding one of the control signal lines CSLa, CSLb, and CSLc separated from each other.

The camera module acting as the master or slave camera may vary based on the zoom factor or an operation mode signal. For example, when the FOV of the camera module 1100a is larger than that of the camera module 1100b, and the zoom factor indicates a low zoom ratio, the camera module 1100b may act as a master camera, while the camera module 1100a may act as a slave camera. Conversely, when the zoom factor indicates a high zoom ratio, the camera module 1100a may act as a master camera, while the camera module 1100b may act as a slave camera.

The control signal from the camera module controller 1216 provided to each of the camera modules 1100a, 1100b, and 1100c may include a sync enable signal. For example, when the camera module 1100b is the master camera, and each of the camera modules 1100a and 1100c is the slave camera, the camera module controller 1216 may transmit the sync enable signal to the camera module 1100b. Upon receiving such a sync enable signal, the camera module 1100b may generate a sync signal based on the provided sync enable signal, and may provide the generated sync signal to the camera modules 1100a and 1100c via a sync signal line SSL. The camera module 1100b and the camera modules 1100a and 1100c may transmit the image data to the application processor 1200 while the camera module 1100b and the camera modules 1100a and 1100c are synchronized with each other using the sync signal.

The control signal from the camera module controller 1216 provided to each of the plurality of camera modules 1100a, 1100b, and 1100c may include mode information according to the mode signal. Based on this mode information, the plurality of camera modules 1100a, 1100b, and 1100c may operate in a first operation mode or a second operation mode in relation to a sensing speed.

In a first operation mode, the plurality of camera modules 1100a, 1100b, and 1100c may generate an image signal at a first speed (for example, may generate an image signal at a first frame rate), may encode the image signal at a second speed higher than the first speed (for example, encode the image signal at a second frame rate higher than the first frame rate) and may transmit the encoded image signal to the application processor 1200. The second speed may be lower than or equal to 30 times of the first speed. The application processor 1200 may store the received image signal, i.e., the encoded image signal, in the internal memory 1230 provided therein, or the external memory 1400 external to the application processor 1200, and then, read and decode the encoded image signal from the internal memory 1230 or the external memory 1400, and then, display image data generated based on the decoded image signal. For example, a corresponding auxiliary processor among the plurality of auxiliary image processors 1212a, 1212b, and 1212c of the image processing device 1210 may perform the decoding, and may perform the image processing on the decoded image signal.

In a second operation mode, the plurality of camera modules 1100a, 1100b, and 1100c may generate an image signal at a third speed lower than the first speed (for example, generate an image signal at a third frame rate lower than the first frame rate), and then transmit the image signal to the application processor 1200. The image signal provided to the application processor 1200 may be an unencoded signal. The application processor 1200 may perform image processing on the received image signal or may store the image signal in the internal memory 1230 or the external memory 1400.

The PMIC 1300 may supply power, e.g., a power supply voltage to each of the plurality of camera modules 1100a, 1100b, and 1100c. For example, the PMIC 1300 may supply first power to the camera module 1100a through a first power signal line PSLa, supply second power to the camera module 1100b through a second power signal line PSLb, and supply third power to the camera module 1100c through a third power signal line PSLc, under control of the application processor 1200. The PMIC 1300 may generate power corresponding to each of the plurality of camera modules 1100a, 1100b, and 1100c and adjust a power level, in response to a power control signal PCON from the application processor 1200. The power control signal PCON may include an operation mode-based power adjustment signal for the plurality of camera modules 1100a, 1100b, and 1100c. For example, the operation mode may include a low power mode. The power control signal PCON may include information about a camera module operating in the low power mode and information about a set power level. Levels of powers respectively provided to the plurality of camera modules 1100a, 1100b, and 1100c may be the same as or different from each other. Further, the level of the power may vary dynamically.

By way of summation and review, autofocusing may be used to automatically set a focus of an image sensor. Phase difference autofocusing (PDAF) may be considered for a fast focus detection speed. In the PDAF, light passing through an imaging lens is divided into light beams, which in turn are detected at different focus detection pixels, and then a focusing lens automatically operates to allow detected signals to have the same intensity at the same phase to adjust a focal length. It is useful to detect foci of various directions efficiently and automatically. Autofocusing may be performed using a separate AF sensor having a size that is much smaller than that of an image sensor, or autofocusing may be performed by placing a focus detection pixel separately from an image detection pixel into a portion of the image sensor and using an AF module inside the image sensor. Another structure uses a dual pixel image sensor, in which every one of the focus detection pixels or every one of the image detection pixels is composed of a pair of photoelectric conversion elements to increase a focus detection speed. The dual pixel image sensor may perform the phase-difference autofocusing detection operation on a pixel-by-pixel basis to significantly improve focus detection speed and accuracy. In this structure, every one of the image detection pixels is composed of the dual pixels, while a separate focus detection pixel is absent. Thus, autofocusing may be accurately and quickly performed without degrading an image resolution.

As described above, embodiments may to provide an image sensor that efficiently performs an autofocusing operation on a diagonal direction. Embodiments may provide an image sensing system that efficiently performs an autofocusing operation on a diagonal direction. Embodiments may provide an image sensor including a dual pixel that efficiently performs an autofocusing operation on various directions.

Example embodiments have been disclosed herein, and although specific terms are employed, they are used and are to be interpreted in a generic and descriptive sense only and not for purpose of limitation. Where used herein, the terms "first," "second," "third," etc., are simply to aid in referring to various features, and do not indicate or imply a specific order unless expressly stated as such. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An image sensor, comprising:
   a substrate:
   a pixel defining pattern disposed within the substrate and formed in a mesh form, wherein the pixel defining pattern defines each of a plurality of pixel areas along the mesh form;
   a first division pattern extending along a first direction for dividing at least one pixel area among the plurality of pixel areas into two half portions;
   a second division pattern extending along a second direction for dividing the at least one pixel area into two half portions, wherein the second direction intersects the first direction;
   a first diagonal division pattern extending along a first diagonal direction for dividing the at least one pixel area into two half portions, wherein the first diagonal direction intersects the first direction and the second direction;
   a second diagonal division pattern extending along a second diagonal direction for dividing the at least one pixel area into two half portions, wherein the second diagonal direction intersects the first direction and the second direction, and the first diagonal direction;
   first and second photodiodes disposed in the at least one pixel area and between the first division pattern and the first diagonal division pattern, wherein the first and second photodiodes are separated from each other via the first division pattern and the first diagonal division pattern;
   third and fourth photodiodes disposed in the at least one pixel area, and between the second division pattern and the first diagonal division pattern, wherein the third and fourth photodiodes are separated from each other via the second division pattern and the first diagonal division pattern;
   fifth and sixth photodiodes disposed in the at least one pixel area, and between the first division pattern and the second diagonal division pattern, wherein the fifth and sixth photodiodes are separated from each other via the first division pattern and the second diagonal division pattern; and
   seventh and eighth photodiodes disposed in the at least one pixel area, and between the second division pattern and the second diagonal division pattern, wherein the seventh and eighth photodiodes are separated from each other via the second division pattern and the second diagonal division pattern.

2. The image sensor as claimed in claim 1, wherein:
   the first photodiode and the third photodiode are separated from each other via the first diagonal division pattern and are disposed adjacent to each other,
   the second photodiode and the fourth photodiode are separated from each other via the first diagonal division pattern and are disposed adjacent to each other, and
   in a first operation mode, a first binning operation is performed based on a first sensed signal generated from the first photodiode and a fourth sensed signal generated from the fourth photodiode, and a second binning operation is performed based on a second sensed signal generated from the second photodiode and a third sensed signal generated from the third photodiode.

3. The image sensor as claimed in claim 2, wherein in the first operation mode, the first binning operation is performed on the first sensed signal and the fourth sensed signal and at a first time to output a first image signal, and the second binning operation is performed on the second sensed signal and the third sensed signal and at a second time to output a second image signal, wherein the second time is different from the first time.

4. The image sensor as claimed in claim 3, wherein the image sensor further comprises a floating diffusion area for accumulating therein charges from the first to eighth sensed signals respectively generated from the first to eighth photodiodes.

5. The image sensor as claimed in claim 2, wherein the image sensor further comprises a readout circuit for receiving first to fourth pixel signals respectively based on the first to fourth sensed signals, and
   wherein in the first operation mode, the readout circuit performs a first analog binning operation on the first pixel signal and the fourth pixel signal at a first time to output a first image signal, and performs a second analog binning operation on the second pixel signal and the third pixel signal at the first time to output a second image signal.

6. The image sensor as claimed in claim 5, further comprising:
   a first floating diffusion area for accumulating therein charges of the first sensed signal generated from the first photodiode;
   a second floating diffusion area for accumulating therein charges of the second sensed signal generated from the second photodiode;
   a third floating diffusion area for accumulating therein charges of the third sensed signal generated from the third photodiode; and
   a fourth floating diffusion area for accumulating therein charges of the fourth sensed signal generated from the fourth photodiode,
   wherein the first to fourth floating diffusion areas are separated from each other via the first and second division patterns and the first and second diagonal division patterns.

7. The image sensor as claimed in claim 2, wherein in a second operation mode different from the first operation mode, a first binning operation is performed based on the first sensed signal generated from the first photodiode and the third sensed signal generated from the third photodiode, and a second binning operation is performed based on the second sensed signal generated from the second photodiode and the fourth sensed signal generated from the fourth photodiode.

8. The image sensor as claimed in claim 2, wherein in a third operation mode different from the first operation mode, a binning operation is performed based on the first sensed signal generated from the first photodiode, the second sensed signal generated from the second photodiode, the third sensed signal generated from the third photodiode, and the fourth sensed signal generated from the fourth photodiode.

9. The image sensor as claimed in claim 1, further comprising a lens disposed to cover the first to eighth photodiode in a plan view of the image sensor.

10. The image sensor as claimed in claim 1, wherein:
the image sensor further comprises a color filter grid formed in the same mesh form as the mesh form of the pixel defining pattern, at least a portion of the color filter grid overlapping the pixel defining pattern in a plan view of the image sensor,
the color filter grid defines an area in which a color filter is disposed, and
the color filter includes a green color filter.

11. An image sensor, comprising:
a substrate:
a pixel defining pattern disposed within the substrate and formed in a mesh form, wherein the pixel defining pattern defines each of a plurality of pixel areas along the mesh form;
a first division pattern extending along a first direction for dividing at least one pixel area among the plurality of pixel areas into two half portions;
a second division pattern extending along a second direction for dividing the at least one pixel area into two half portions, wherein the second direction intersects the first direction;
a first diagonal division pattern extending along a first diagonal direction for dividing the at least one pixel area into two half portions, wherein the first diagonal direction intersects the first direction and the second direction;
first and second photodiodes disposed in the at least one pixel area and between the first division pattern and the first diagonal division pattern, wherein the first and second photodiodes are separated from each other via the first division pattern and the first diagonal division pattern; and
third and fourth photodiodes disposed in the at least one pixel area, and between the second division pattern and the first diagonal division pattern, wherein the third and fourth photodiodes are separated from each other via the second division pattern and the first diagonal division pattern, wherein:
the first photodiode and the third photodiode are separated from each other via the first diagonal division pattern and are disposed adjacent to each other,
the second photodiode and the fourth photodiode are separated from each other via the first diagonal division pattern and are disposed adjacent to each other, and
in a first operation mode, a first binning operation is performed based on a first sensed signal generated from the first photodiode and a fourth sensed signal generated from the fourth photodiode, and a second binning operation is performed based on a second sensed signal generated from the second photodiode and a third sensed signal generated from the third photodiode.

12. The image sensor as claimed in claim 11, further comprising:
a second diagonal division pattern extending along a second diagonal direction for dividing the at least one pixel area into two half portions, wherein the second diagonal direction intersects the first direction and the second direction, and the first diagonal direction;
fifth and sixth photodiodes disposed in the at least one pixel area, and between the first division pattern and the second diagonal division pattern, wherein the fifth and sixth photodiodes are separated from each other via the first division pattern and the second diagonal division pattern; and
seventh and eighth photodiodes disposed in the at least one pixel area, and between the second division pattern and the second diagonal division pattern, wherein the seventh and eighth photodiodes are separated from each other via the second division pattern and the second diagonal division pattern.

13. The image sensor as claimed in claim 12, further comprising a lens disposed to cover the first to eighth photodiode in a plan view of the image sensor.

14. The image sensor as claimed in claim 11, wherein in the first operation mode, the first binning operation is performed on the first sensed signal and the fourth sensed signal and at a first time to output a first image signal, and the second binning operation is performed on the second sensed signal and the third sensed signal and at a second time to output a second image signal, wherein the second time is different from the first time.

15. The image sensor as claimed in claim 11, wherein the image sensor further comprises a readout circuit for receiving first to fourth pixel signals respectively based on the first to fourth sensed signals, and
wherein in the first operation mode, the readout circuit performs a first analog binning operation on the first pixel signal and the fourth pixel signal at a first time to output a first image signal, and performs a second analog binning operation on the second pixel signal and the third pixel signal at the first time to output a second image signal.

16. The image sensor as claimed in claim 11, wherein in a second operation mode different from the first operation mode, a first binning operation is performed based on the first sensed signal generated from the first photodiode and the third sensed signal generated from the third photodiode, and a second binning operation is performed based on the second sensed signal generated from the second photodiode and the fourth sensed signal generated from the fourth photodiode.

17. An image sensing system, comprising:
an image sensor for outputting an image signal; and
an image signal processor connected to the image sensor for receiving and processing the image signal,
wherein the image sensor includes:
a substrate;
a pixel defining pattern disposed within the substrate and formed in a mesh form, wherein the pixel defining pattern defines each of a plurality of pixel areas along the mesh form;
a first division pattern extending along a first direction for dividing at least one pixel area among the plurality of pixel areas into two half portions;
a second division pattern extending along a second direction for dividing the at least one pixel area into two half portions, wherein the second direction intersects the first direction;
a first diagonal division pattern extending along a first diagonal direction for dividing the at least one pixel area into two half portions, wherein the first diagonal direction intersects the first direction and the second direction;
a second diagonal division pattern extending along a second diagonal direction for dividing the at least one pixel area into two half portions, wherein the second diagonal direction intersects the first direction and the second direction, and the first diagonal direction;

first and second photodiodes disposed in the at least one pixel area and between the first division pattern and the first diagonal division pattern, wherein the first and second photodiodes are separated from each other via the first division pattern and the first diagonal division pattern;

third and fourth photodiodes disposed in the at least one pixel area, and between the second division pattern and the first diagonal division pattern, wherein the third and fourth photodiodes are separated from each other via the second division pattern and the first diagonal division pattern;

fifth and sixth photodiodes disposed in the at least one pixel area, and between the first division pattern and the second diagonal division pattern, wherein the fifth and sixth photodiodes are separated from each other via the first division pattern and the second diagonal division pattern; and seventh and eighth photodiodes disposed in the at least one pixel area, and between the second division pattern and the second diagonal division pattern, wherein the seventh and eighth photodiodes are separated from each other via the second division pattern and the second diagonal division pattern.

18. The image sensing system as claimed in claim 17, wherein the first photodiode and the third photodiode are separated from each other via the first diagonal division pattern and are disposed adjacent to each other, wherein the second photodiode and the fourth photodiode are separated from each other via the first diagonal division pattern and are disposed adjacent to each other, and wherein in a first operation mode, a first binning operation is performed based on a first sensed signal generated from the first photodiode and a fourth sensed signal generated from the fourth photodiode, and a second binning operation is performed based on a second sensed signal generated from the second photodiode and a third sensed signal generated from the third photodiode.

19. The image sensing system as claimed in claim 18, wherein in the first operation mode, the first binning operation is performed on the first sensed signal and the fourth sensed signal and at a first time to output a first image signal, and the second binning operation is performed on the second sensed signal and the third sensed signal and at a second time to output a second image signal, wherein the second time is different from the first time.

20. The image sensing system as claimed in claim 18, wherein the image sensor further includes a readout circuit for receiving the first to fourth sensed signals and then outputting first to fourth image signals respectively based on the first to fourth sensed signals, and wherein in the first operation mode, the image signal processor performs a first digital binning operation on the first image signal and the fourth image signal at a first time, and performs a second digital binning operation on the second image signal and the third image signal at the first time.

* * * * *